US008681551B2

(12) United States Patent
Maejima

(10) Patent No.: US 8,681,551 B2
(45) Date of Patent: *Mar. 25, 2014

(54) THREE DIMENSIONAL STACKED NONVOLATILE SEMICONDUCTOR MEMORY

(71) Applicant: Kabushiki Kaisha Toshiba, Minato-ku (JP)

(72) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/738,633

(22) Filed: Jan. 10, 2013

(65) Prior Publication Data

US 2013/0121076 A1    May 16, 2013

Related U.S. Application Data

(63) Continuation of application No. 13/336,122, filed on Dec. 23, 2011, now Pat. No. 8,379,449, which is a continuation of application No. 12/953,690, filed on Nov. 24, 2010, now Pat. No. 8,102,711, which is a continuation of application No. 12/407,094, filed on Mar. 19, 2009, now Pat. No. 7,859,902.

(30) Foreign Application Priority Data

Apr. 23, 2008 (JP) ................................ 2008-112659

(51) Int. Cl.
*G11C 16/04* (2006.01)
(52) U.S. Cl.
USPC ............. 365/185.11; 365/185.05; 365/185.23

(58) Field of Classification Search
USPC ........ 365/185.11, 185.05, 185.18, 185.24, 51
See application file for complete search history.

(56) References Cited

U.S. PATENT DOCUMENTS

| 5,896,317 A | 4/1999 | Ishii et al. |
| 6,141,250 A | 10/2000 | Kashimura |

(Continued)

FOREIGN PATENT DOCUMENTS

| JP | 6-338602 | 12/1994 |
| JP | 10-320988 | 12/1998 |

(Continued)

OTHER PUBLICATIONS

H. Tanaka, et al., "Bit Cost Scalable Technology with Punch and Plug Process for Ultra High Density Flash Memory", 2007 Symposium on VLSI Technology Digest of Technical Papers, pp. 14-15.

(Continued)

*Primary Examiner* — Gene Auduong
(74) *Attorney, Agent, or Firm* — Oblon, Spivak, McClelland, Maier & Neustadt, L.L.P.

(57) ABSTRACT

A three dimensional stacked nonvolatile semiconductor memory according to an example of the present invention includes a memory cell array comprised of first and second blocks. The first block has a first cell unit which includes a memory cell to be programmed and a second cell unit which does not include a memory cell to be programmed, and programming is executed by applying a program potential or a transfer potential to word lines in the first block after the initial potential of channels of the memory cells in the first and second cell units is set to a plus potential. In the programming, the program potential and the transfer potential are not applied to word lines in the second block.

22 Claims, 26 Drawing Sheets

(56) References Cited

U.S. PATENT DOCUMENTS

| | | |
|---|---|---|
| 7,091,890 B1 | 8/2006 | Sasaki et al. |
| 7,852,675 B2 | 12/2010 | Maejima |
| 7,852,676 B2 | 12/2010 | Maejima |
| 7,859,902 B2 | 12/2010 | Maejima |
| 8,102,711 B2 | 1/2012 | Maejima |
| 2006/0003541 A1 | 1/2006 | Choi et al. |
| 2008/0112211 A1 | 5/2008 | Toda |
| 2009/0010071 A1 | 1/2009 | Lee |
| 2009/0267128 A1 | 10/2009 | Maejima |
| 2009/0267139 A1 | 10/2009 | Maejima |
| 2009/0268522 A1 | 10/2009 | Maejima |
| 2009/0268523 A1 | 10/2009 | Maejima |
| 2010/0097858 A1 | 4/2010 | Tokiwa et al. |
| 2010/0133627 A1 | 6/2010 | Mizukami et al. |
| 2011/0063910 A1 | 3/2011 | Maejima |
| 2011/0063913 A1 | 3/2011 | Maejima |
| 2011/0069550 A1 | 3/2011 | Maejima |

FOREIGN PATENT DOCUMENTS

| | | |
|---|---|---|
| JP | 2004-319577 | 11/2004 |
| JP | 2007-266143 | 10/2007 |
| KR | 10-0674952 | 1/2007 |
| KR | 10-2008-0034816 | 4/2008 |

OTHER PUBLICATIONS

Office Action issued Oct. 25, 2010 in Korean Application N. 10-2009-24113 (w/English translation).

Office Action issued Dec. 11, 2012 in Japanese Application No. 2008-112659 filed Apr. 23, 2008 (w/English translation).

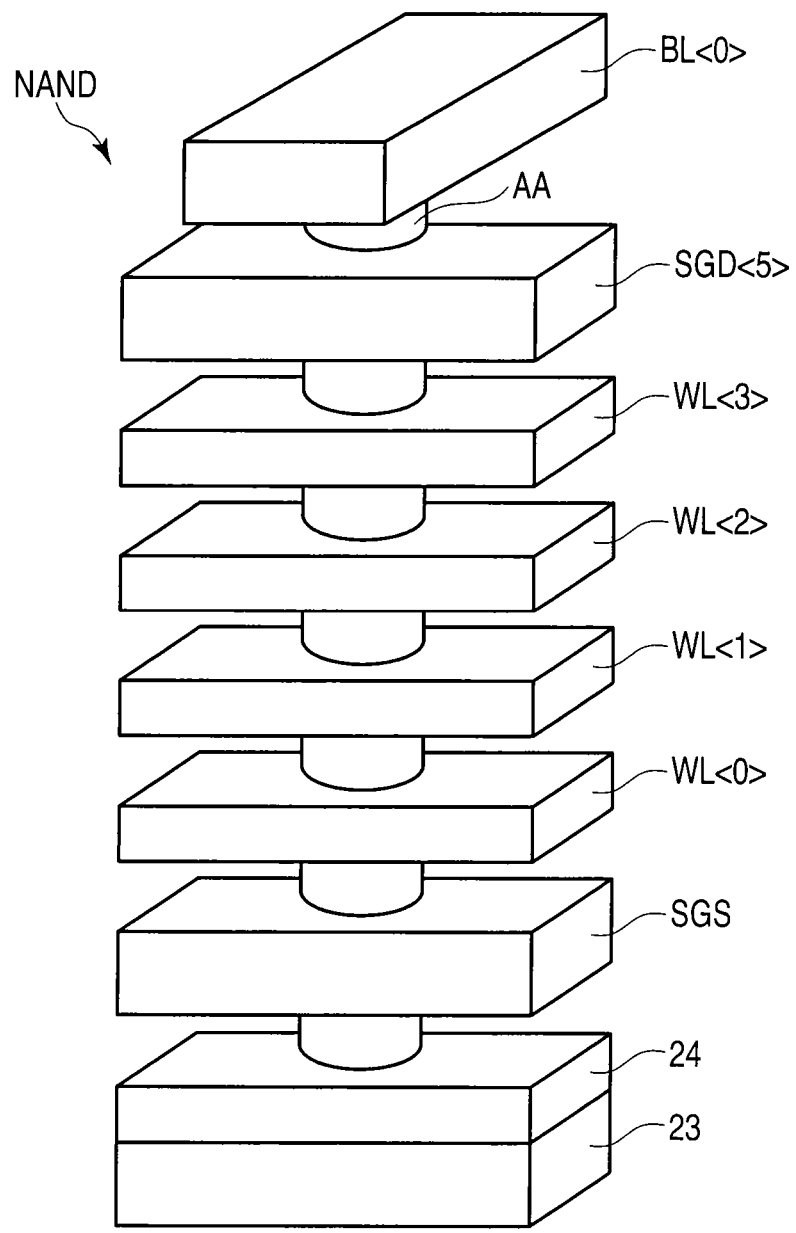
F I G. 6

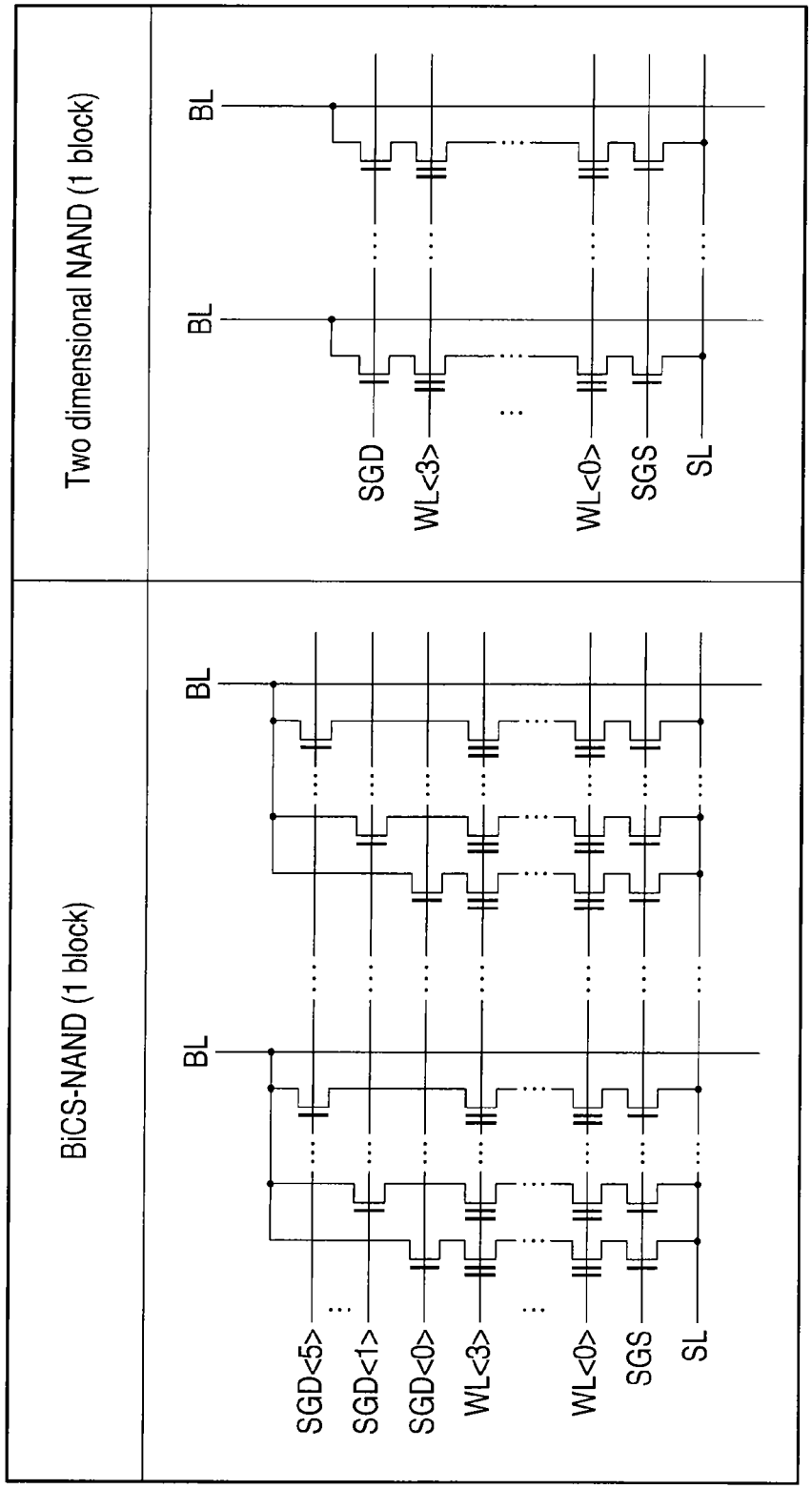
F I G. 8

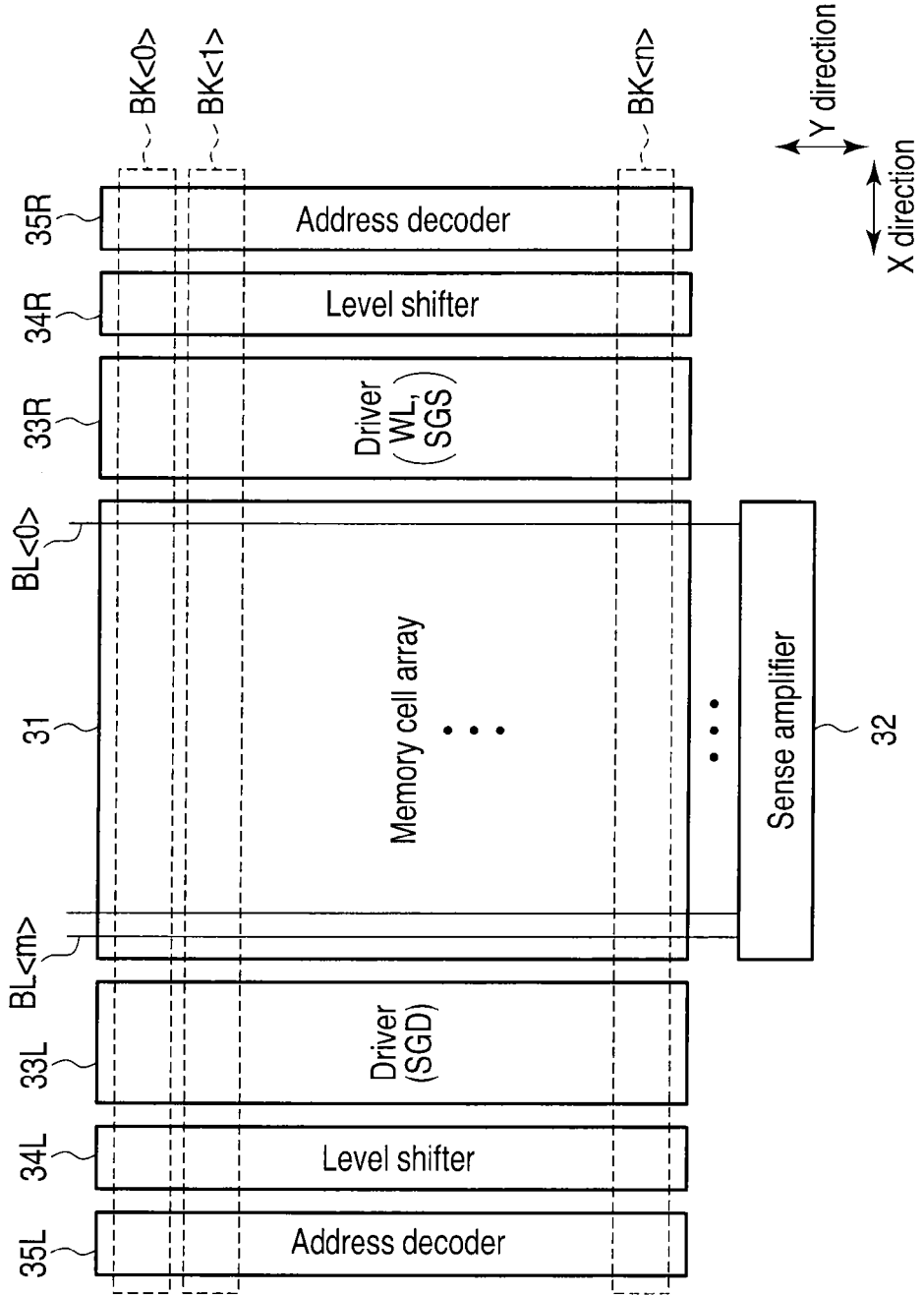
F I G. 9

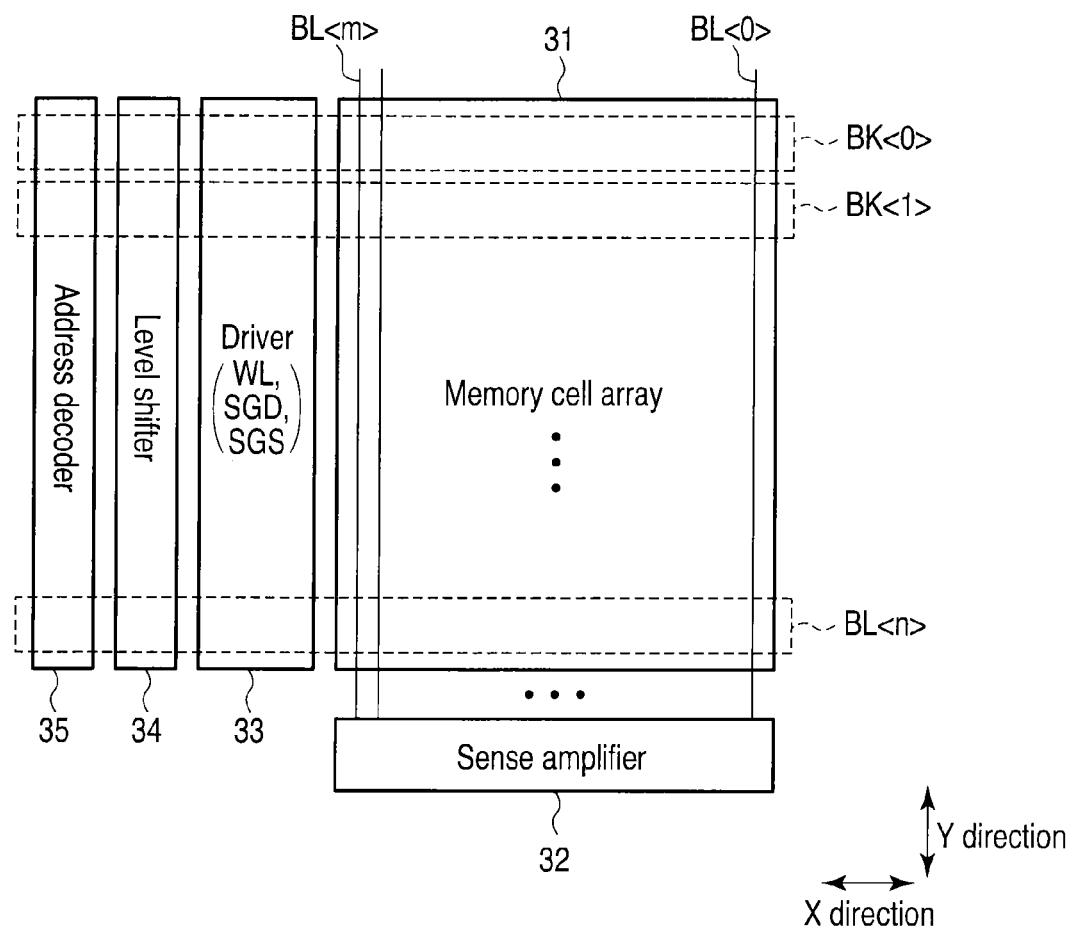
F I G. 10

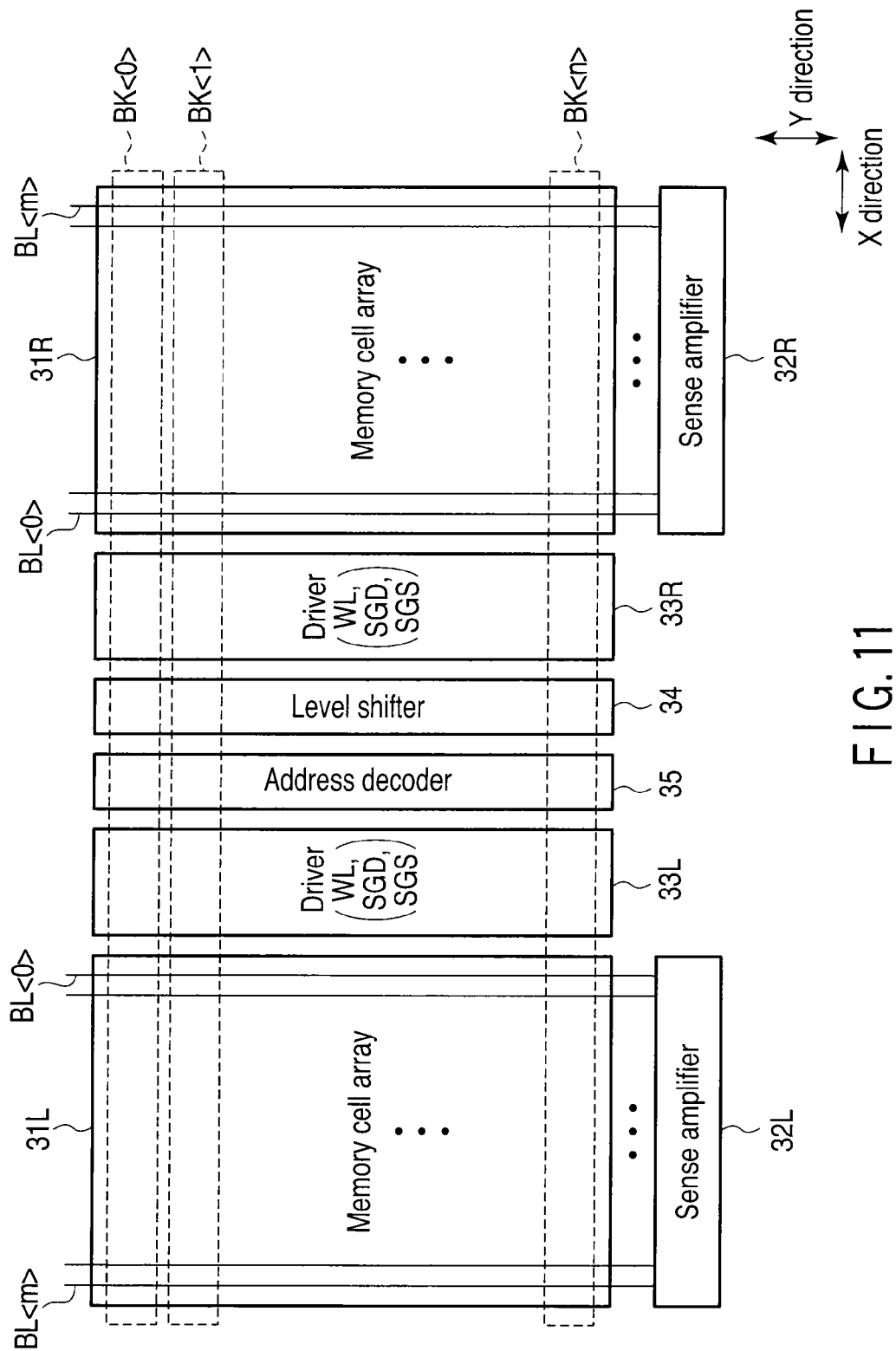
F I G. 11

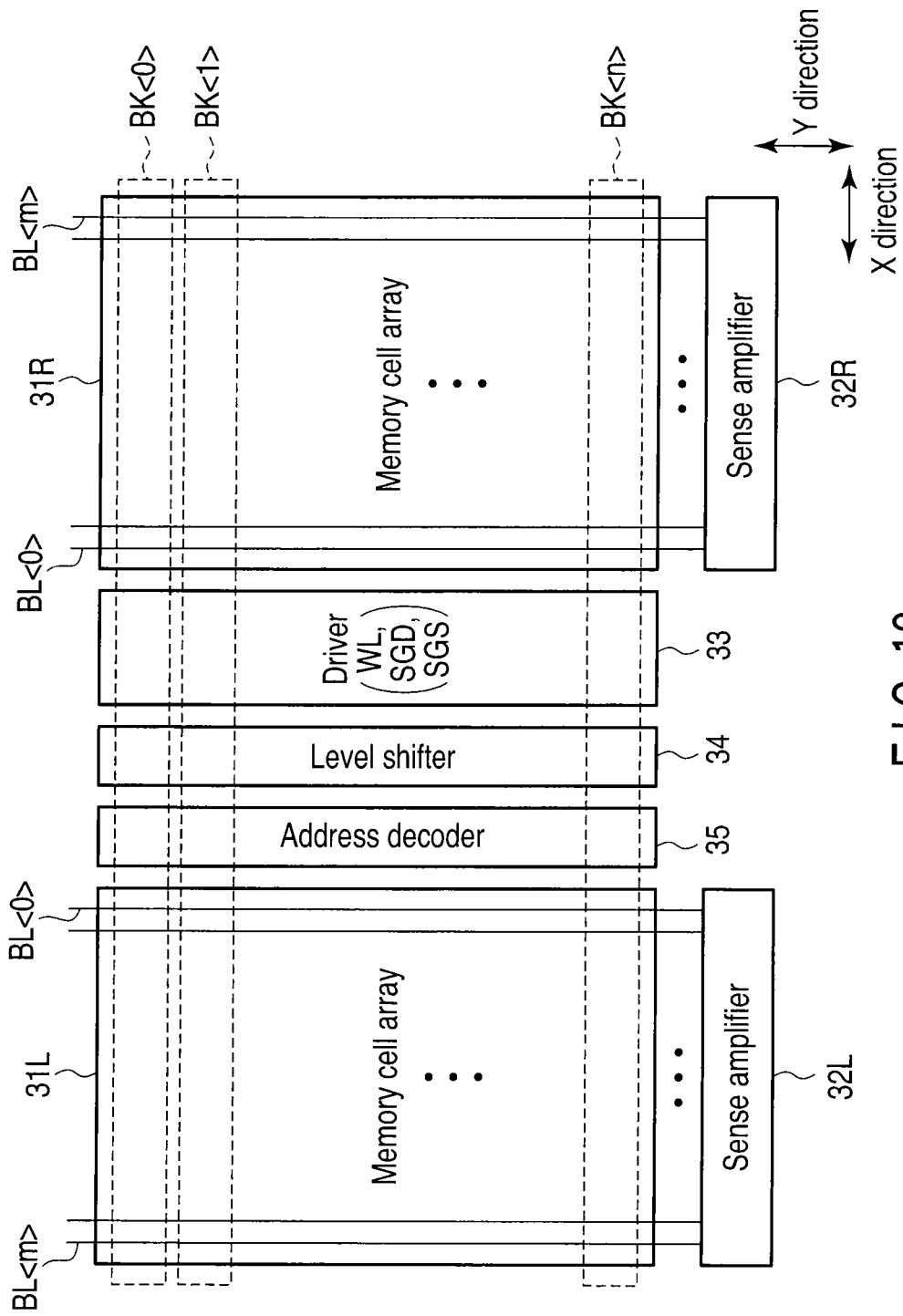
F I G. 12

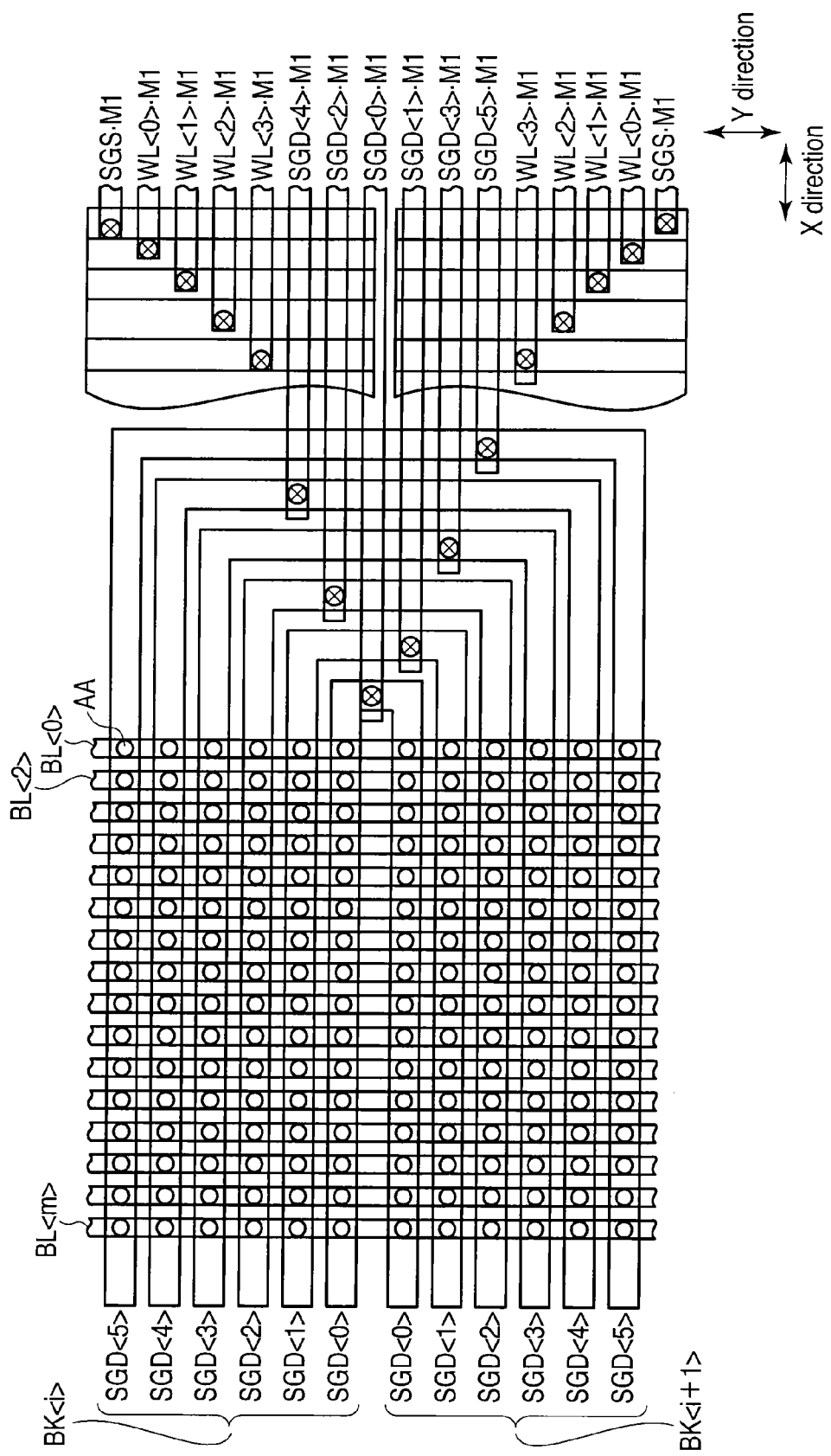
F I G. 16

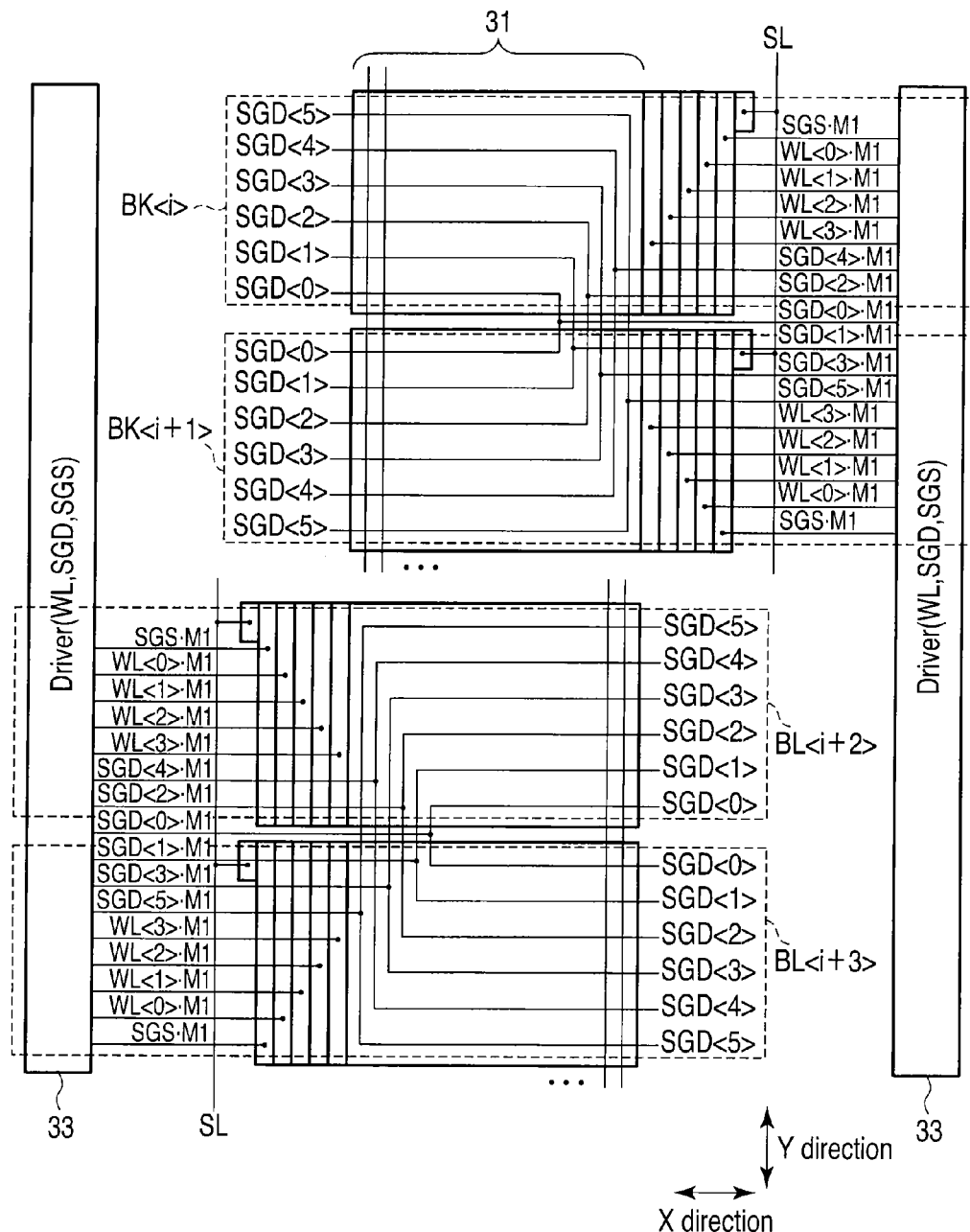
F I G. 17

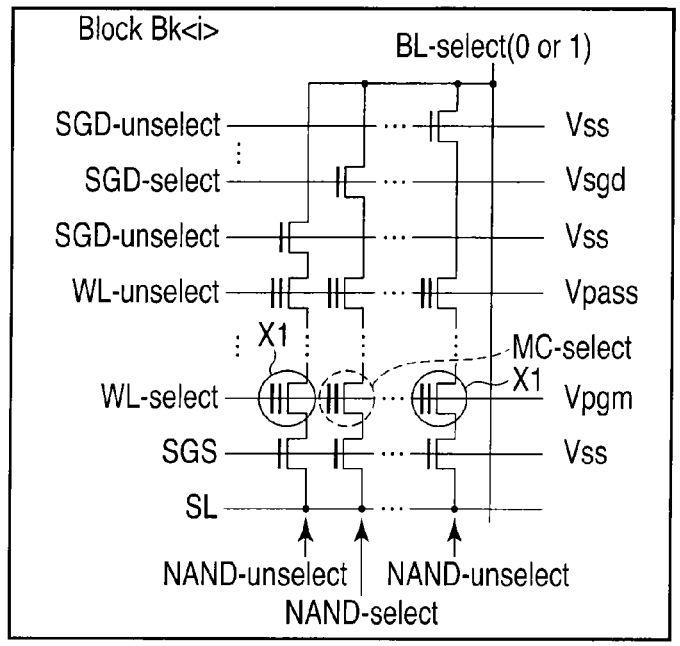
F I G. 20
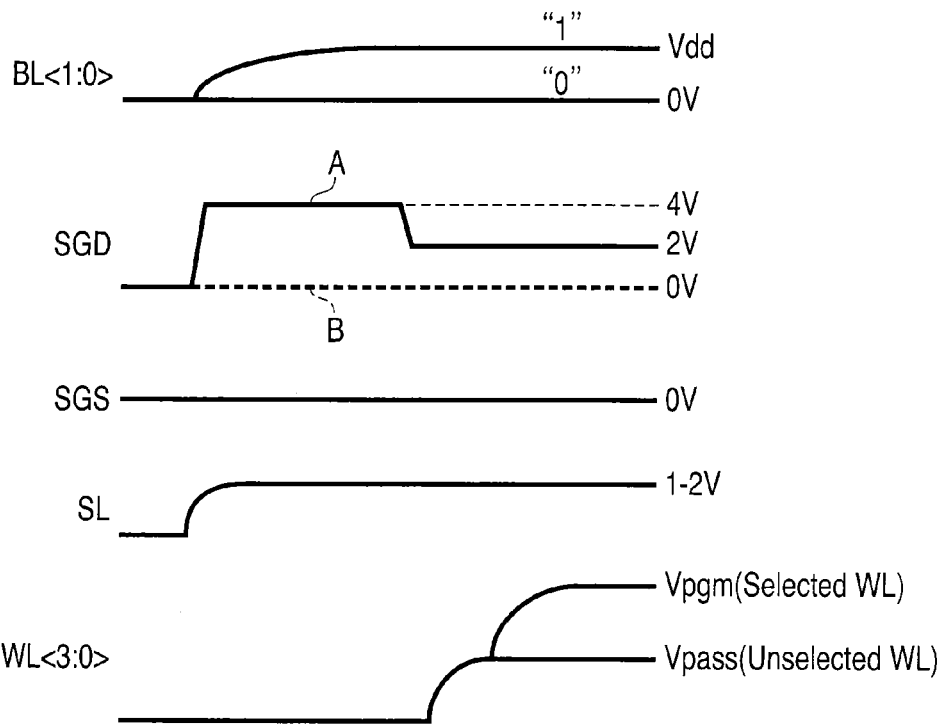
F I G. 21

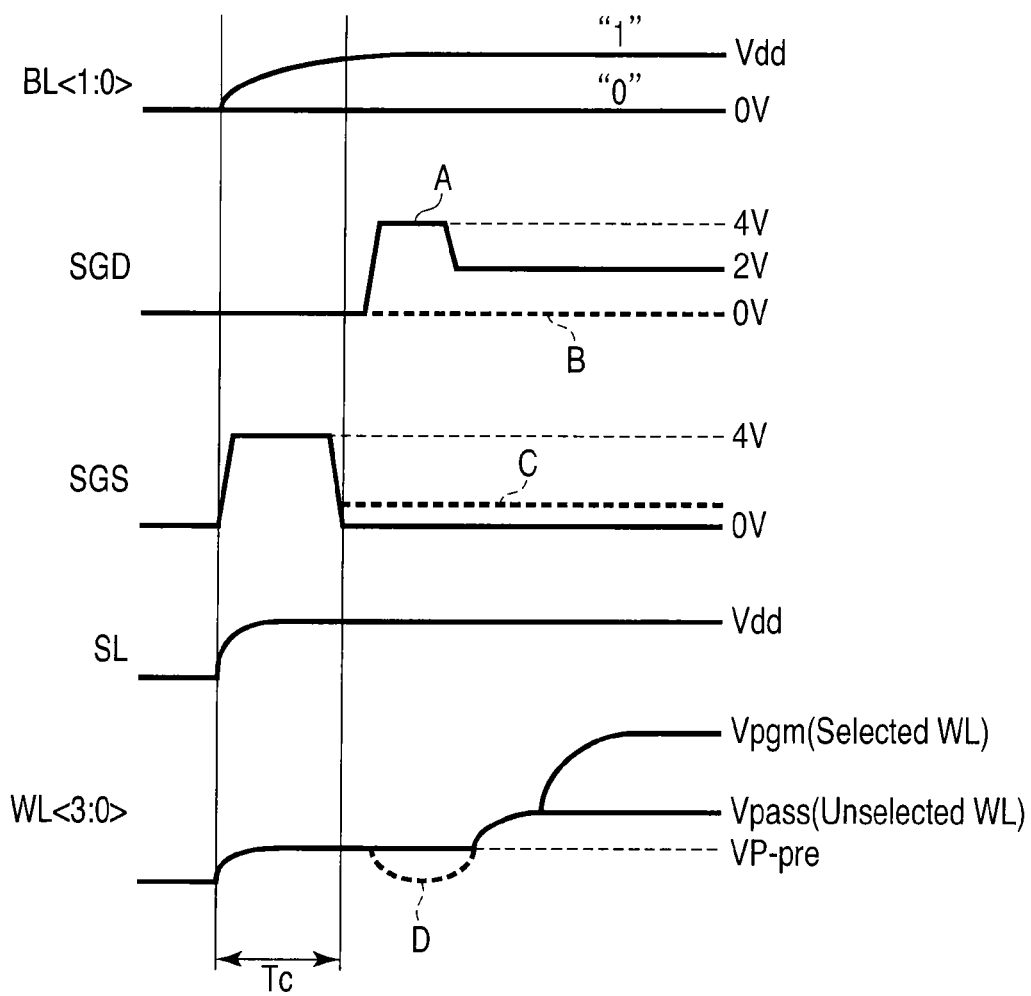
F I G. 24

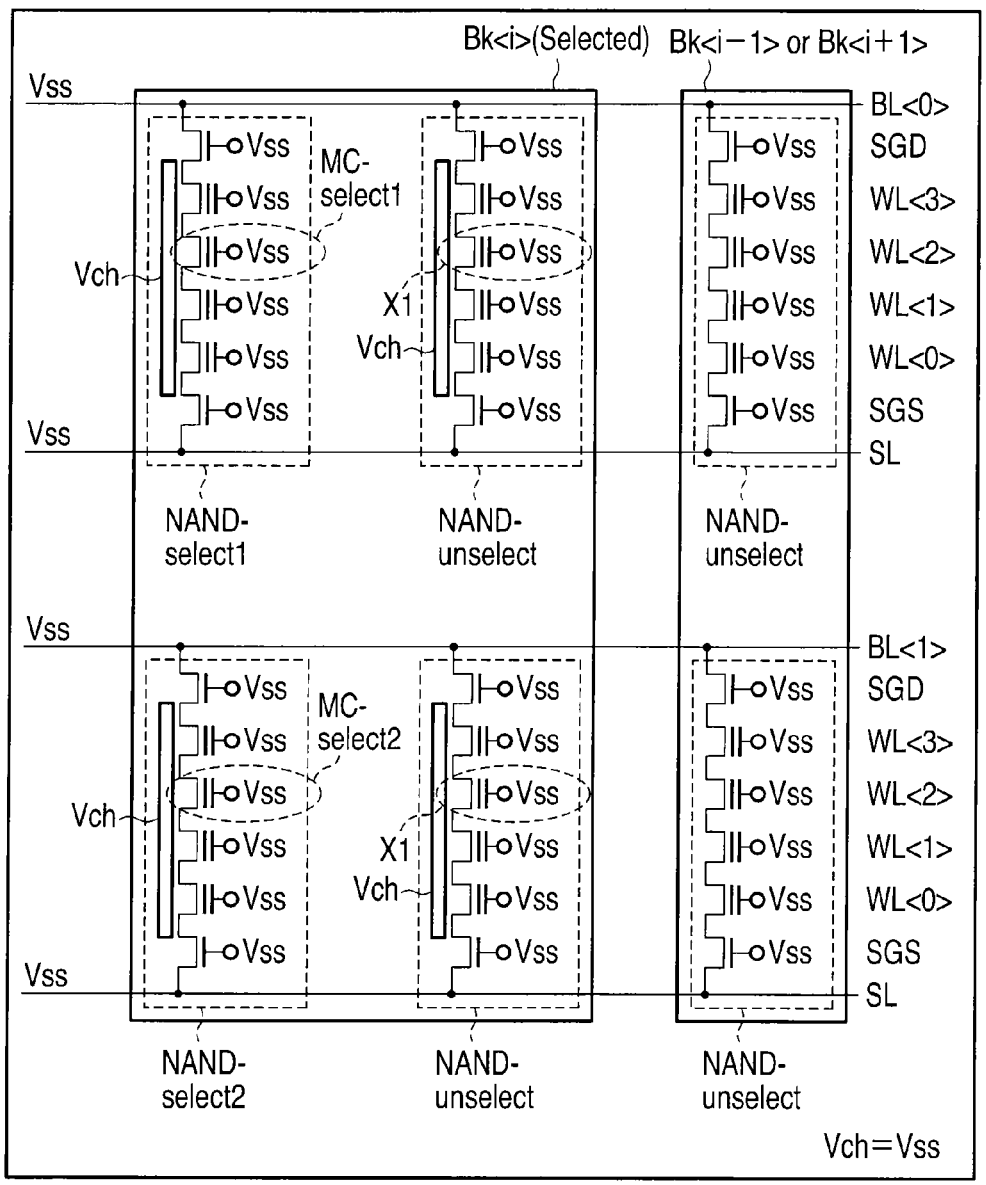
F I G. 25
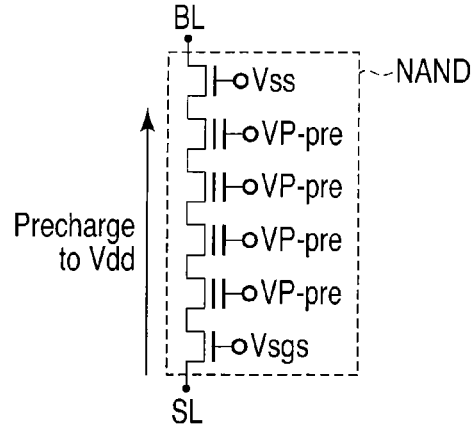
F I G. 26

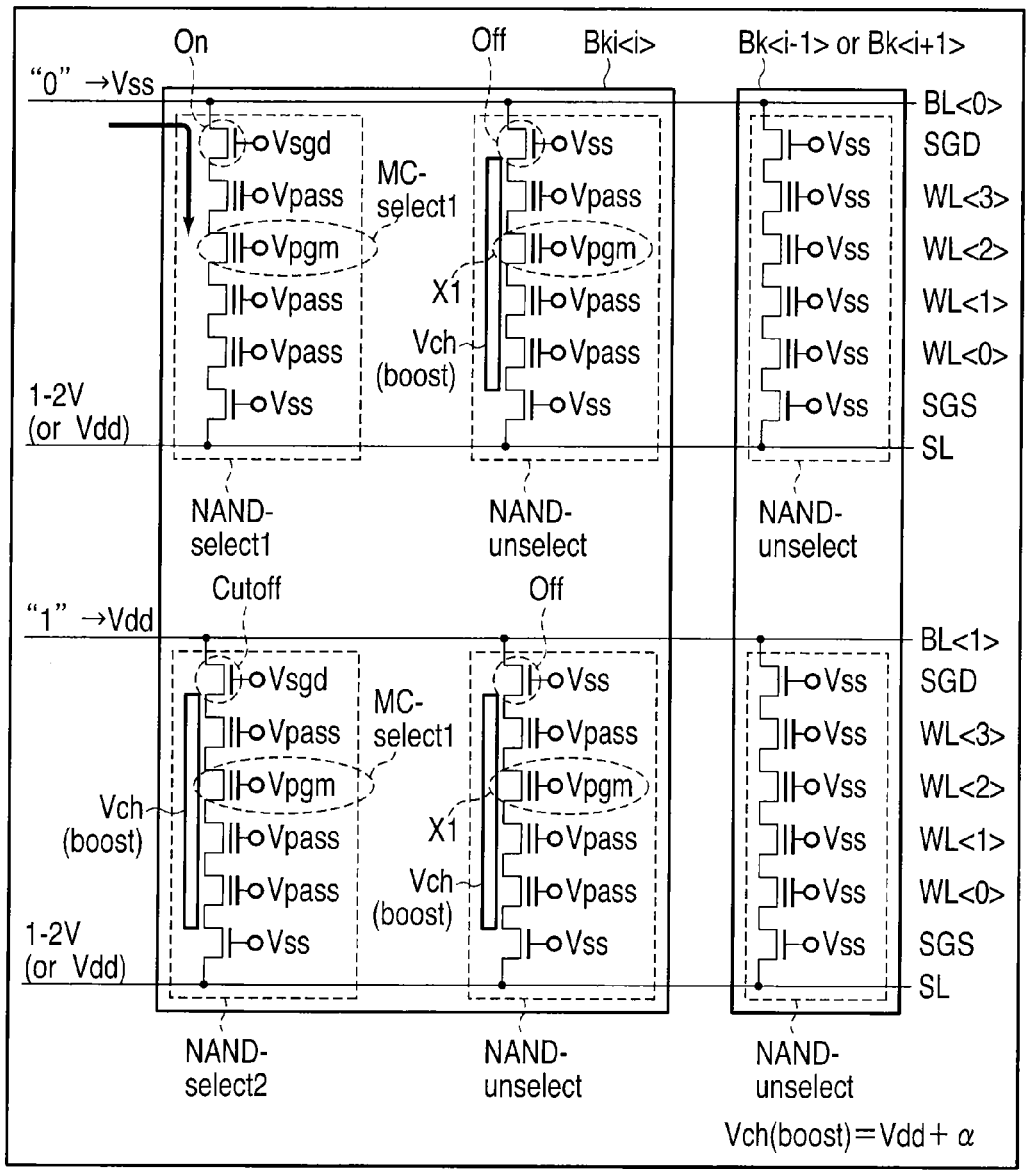
F I G. 28

THREE DIMENSIONAL STACKED NONVOLATILE SEMICONDUCTOR MEMORY

CROSS-REFERENCE TO RELATED APPLICATIONS

This application is a continuation of and claims the benefit of priority under 35 U.S.C. §120 from U.S. Ser. No. 13/336,122 filed Dec. 23, 2011, which is a continuation of Ser. No. 12/953,690 filed Nov. 24, 2010 (now U.S. Pat. No. 8,102,711 issued Jan. 24, 2012), which is a continuation of U.S. Ser. No. 12/407,094 filed Mar. 19, 2009 (now U.S. Pat. No. 7,859,094 issued Dec. 28, 2010), and claims the benefit of priority under 35 U.S.C. §119 from Japanese Patent Application No. 2008-112659 filed Apr. 23, 2008, the entire contents of each of which are incorporated herein by reference.

BACKGROUND OF THE INVENTION

1. Field of the Invention

The present invention relates to a three dimensional stacked nonvolatile semiconductor memory.

2. Description of the Related Art

BiCS (Bit Cost Scalable) technology is known as a technology for suppressing a bit cost of a semiconductor memory by increasing the capacity thereof by a three dimensional structure (refer to, for example, "Bit Cost Scalable Technology with Punch and Plug Process for Ultra High Density Flash Memory" 2007 Symposium on VLSI Technology Digest of Technical Papers. p. 14).

A nonvolatile semiconductor memory to which the BiCS technology is applied (hereinafter, called a BiCS memory) has a feature in that it not only has a three dimensional structure but makes bit cost scalability possible so that a bit cost can be reduced in proportion to an increase of the number of stacked layers by devising a device structure and a process technology.

In, for example, a NAND flash memory to which the BiCS technology is applied (hereinafter, called a BiCS-NAND flash memory), a memory capacity, which greatly exceeds the limit of the memory capacity of a NAND flash memory having a two-dimensional structure, can be realized by increasing the number of cells in a longitudinal direction which comprise a NAND column by increasing the number of stacked layers.

However, since the BiCS memory which is represented by a BiCS-NAND flash memory has a unique device structure, there are many problems to be solved to practically use the BiCS memory.

A program disturb is exemplified as one of the problems.

The BiCS memory has such a feature that cell units are included in one block connected to one bit line. Further, the cell units cannot be selected at the same time from the viewpoint of a circuit operation. Accordingly, a non-selected cell unit which does not include a memory cell to be programmed exists in a selected block.

This problem does not occur in a flash memory having a two dimensional structure.

Therefore, program disturb must be examined to prevent a variation of a threshold voltage of a memory cell in a non-selected cell unit in a selected block in programming.

In particular, in the BiCS memory, since it is not necessary to apply a program potential to a cell unit in a non-selected block different from the flash memory having the two dimensional structure, it is not necessary to examine program disturb to the cell unit in the non-selected block. However, since the program potential is applied to a non-selected cell unit in a selected block, the BiCS memory has a special property in that program disturb occurs in the non-selected cell unit.

BRIEF SUMMARY OF THE INVENTION

A three dimensional stacked nonvolatile semiconductor memory according to an aspect of the present invention comprises a semiconductor substrate, a memory cell array comprised of first and second blocks disposed on the semiconductor substrate side by side in a first direction, and a first driver disposed on one end of the memory cell array in a second direction orthogonal to the first direction.

Each of the first and second blocks is comprised of at least three conductive layers stacked on the semiconductor substrate by being insulated from each other, a bit line disposed on the at least three conductive layers by being insulated therefrom, and columnar semiconductors having lower ends connected to the semiconductor substrate and upper ends connected to the bit line and passing through the at least three conductive layers.

An uppermost layer of the at least three conductive layers is comprised of first select gate lines extending in the second direction, a lowermost layer of the at least three conductive layers is a second select gate line, remaining conductive layers excluding the uppermost layer and the lowermost layer of the at least three conductive layers are a word line, and remaining conductive layers excluding the uppermost layer of the at least three conductive layers have a plate shape whose width in the first direction is larger than the width in the first direction of the first select gate lines.

Select gate transistors are comprised of the first select gate lines and the columnar semiconductors, and the second select gate line and the columnar semiconductors, respectively and memory cells are comprised of the word line and the columnar semiconductors, respectively.

The first block has a selected first cell unit including a memory cell to be programmed and a non-selected second cell unit not including a memory cell to be programmed, and programming is executed to the memory cell to be programmed by applying a program potential or a transfer potential lower than the program potential to the word lines in the first block after an initial potential of channels of the memory cells in the first and second cell units is set to a plus potential. The program potential and the transfer potential are not applied to the word lines in the second block in the programming.

BRIEF DESCRIPTION OF THE SEVERAL VIEWS OF THE DRAWING

FIG. 6 is a bird's eye view of the NAND cell unit;
FIG. 8 is a comparative view comparing a BiCS-NAND with a two-dimensional NAND;
FIG. 9 is a view showing a first example of a block layout;
FIG. 10 is a view showing a second example of the block layout;
FIG. 11 is a view showing a third example of the block layout;
FIG. 12 is a view showing a fourth example of the block layout;

FIG. 16 is a plan view when the select gate lines on the bit line side shown in FIG. 15 are arranged as a device;

FIG. 17 is a view showing a layout of select gate lines on a bit line side;

FIG. 20 is a view explaining the program disturb of the BiCS memory;

FIG. 21 is a timing chart showing a first programming method;

FIG. 24 is a timing chart showing a second programming method;

FIG. 25 is a view showing a potential relation of the second programming method;

FIG. 26 is a view showing how an initial potential is set to a channel from the source line side;

FIG. 28 is a view showing a potential relation of the second programming method.

DETAILED DESCRIPTION OF THE INVENTION

A three dimensional stacked nonvolatile semiconductor memory of an aspect of the present invention will be described below in detail with reference to the accompanying drawing.

1. Outline

Examples of the present invention propose a programming method of preventing program disturb caused by a structure specific to the BiCS memory, i.e., a variation of a threshold value of a memory cell in a non-selected cell unit in a selected block.

When a feature of the BiCS memory is expressed simply from the viewpoint of a circuit, cell units are included in one block connected to one bit line. In this case, a non-selected cell unit, in which a memory cell to be programmed is not included, exists in a selected block in programming.

Further, in the BiCS memory, no program potential is applied to a cell unit in a non-selected block. However, since a program potential is applied to a non-selected cell unit in a selected block, it is necessary to prevent program disturb (variation of threshold value) to the non-selected cell unit.

Thus, the examples of the present invention propose to use a plus potential capable of improving program disturb as an initial potential of a channel of a memory cell in a non-selected cell unit in a selected block.

When the program potential or a transfer potential lower than the program potential is applied to a word line in the selected block, since the potential of the channel can be sufficiently increased by capacitance coupling by using the plus potential as the initial potential of the channel of the memory cell in the non-selected cell unit in the selected block, the program disturb can be improved.

Further, the BiCS memory has a structural feature in that a source diffusion layer common to blocks is formed in a semiconductor substrate. Accordingly, the plus potential can be applied from the source diffusion layer to the channel of the memory cell in the cell unit in the selected block as the initial potential in the programming.

This means that the initial potential of the channel can be set from the source diffusion layer during a period in which a bit line is set to a potential according to program data.

That is, since the bit line has a large capacity, it takes a long time to charge and discharge the bit line. However, this process cannot be omitted. When the plus potential is applied from the source diffusion layer to the channel of the memory cell, this operation can be performed in parallel with the operation for setting the bit line to the potential according to the program data. Therefore, no time penalty newly occurs.

2. BiCS Memory (1) Basic Structure

First, a basic structure of a BiCS memory will be explained.

Figure 1:
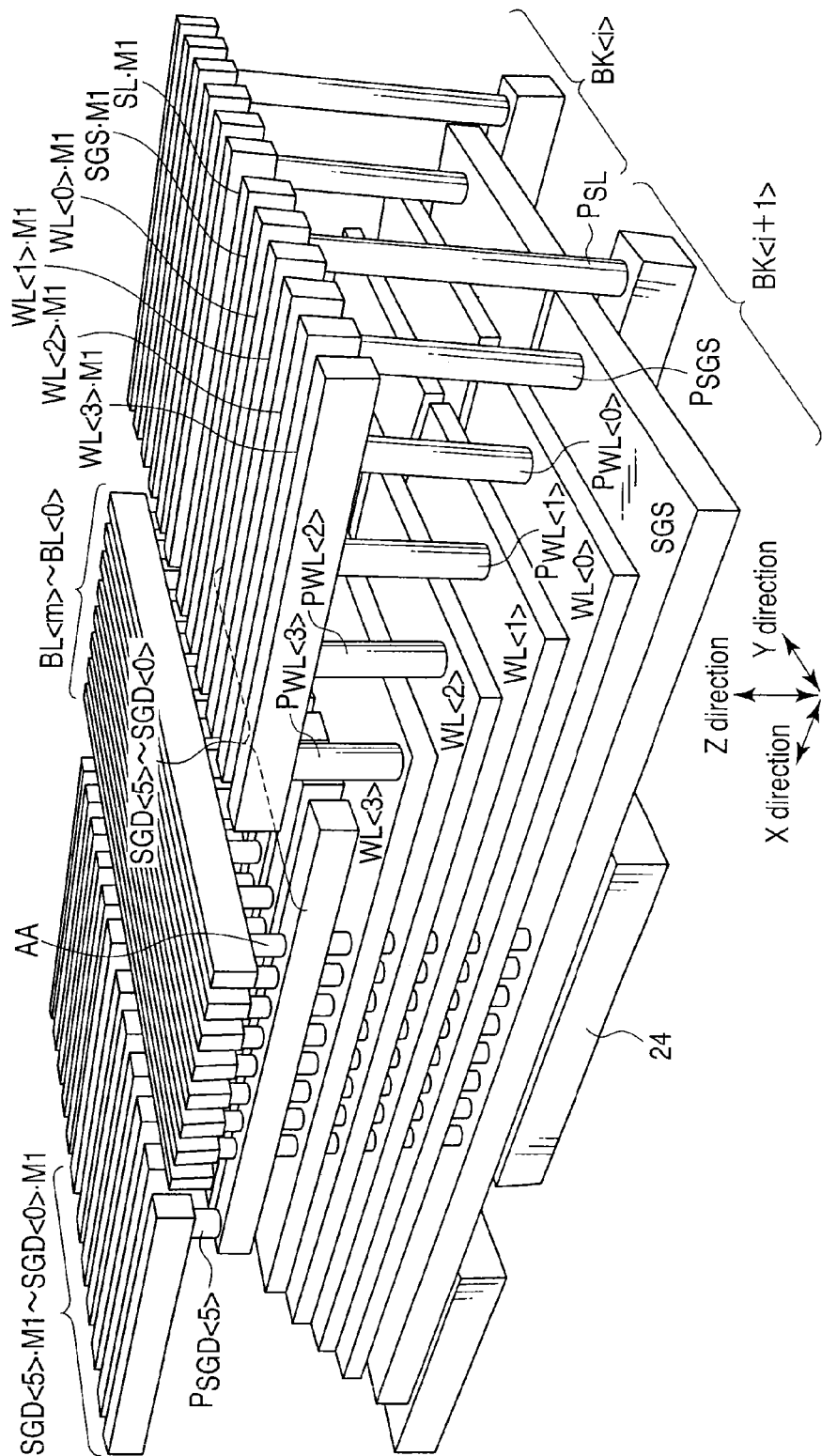
FIG. 1 is a bird's eye view of a BiCS-NAND flash memory.

FIG. 1 shows a bird's eye view of a BiCS-NAND flash memory.

The NAND flash memory is comprised of blocks each of which acts, for example, as a unit to be erased. Here, two blocks BK<i>, BK<i+1> are shown in the figure.

A source diffusion layer 24 formed in a semiconductor substrate is shared by, for example, all the blocks. The source diffusion layer 24 is connected to a source line SL•M1 through a contact plug $P_{SL}$.

Further, at least three conductive layers (in the example, six-layer structure) comprised of, for example, conductive polysilicon are laminated on the source diffusion layer 24.

The remaining five conductive layers excluding the uppermost layer are formed in a plate shape, respectively in the one block BK<i+1> as well as the ends thereof in the X-direction are formed stepwise so that they are in contact with the respective conductive layers. A lowermost layer acts as a select gate line SGS on the source line side, and the remaining four conductive layers excluding the lowermost and uppermost layers act as word lines WL<0>, WL<1>, WL<2>, and WL<3>.

The uppermost layer is comprised of line-shaped conductive wires extending in the X-direction. Six conductive wires, for example, are disposed in the one block BK<i+1>. The six conductive wires, for example, of the uppermost layer act as select gate lines SGD<0>, . . . , SGD<5> on a bit line side.

Active layers (active areas) AA for comprising a NAND cell unit are formed columnarly in a Z-direction (direction vertical to the front surface of the semiconductor substrate) so that they reach the source diffusion layer 24 passing through the conductive layers.

The upper ends of the active layers AA are connected to bit lines BL<0>, . . . , BL<m> extending in a Y-direction. Further, the select gate line SGS on the source line side is connected to an interconnect line SGS•M1 extending in the X-direction through a contact plug $P_{SGS}$, and the word lines WL<0>, WL<1>, WL<2>, and WL<3> are connected to interconnect lines WL<0>•M1, WL<1>•M1, WL<2>•M1, and WL<3>•M1 extending in the X-direction through contact plugs $P_{WL<0>}$, $P_{WL<1>}$, $P_{WL<2>}$, $P_{WL<3>}$, respectively.

Further, select gate lines SGD<0>, . . . , SGD<5> on the bit line side are connected to interconnect lines SGD<0>•M1, . . . , SGD<5>•M1 extending in the X-direction through contact plugs $P_{SGD<0>}$, . . . , $P_{SGD<5>}$, respectively.

The bit lines BL<0>, . . . , BL<m> and the interconnect lines SGS•M1, WL<0>•M1, WL<1>•M1, WL<2>•M1, and WL<3>•M1, SGD<0>•M1, . . . , SGD<5>•M1 are comprised of, for example, metal.

Figure 2:
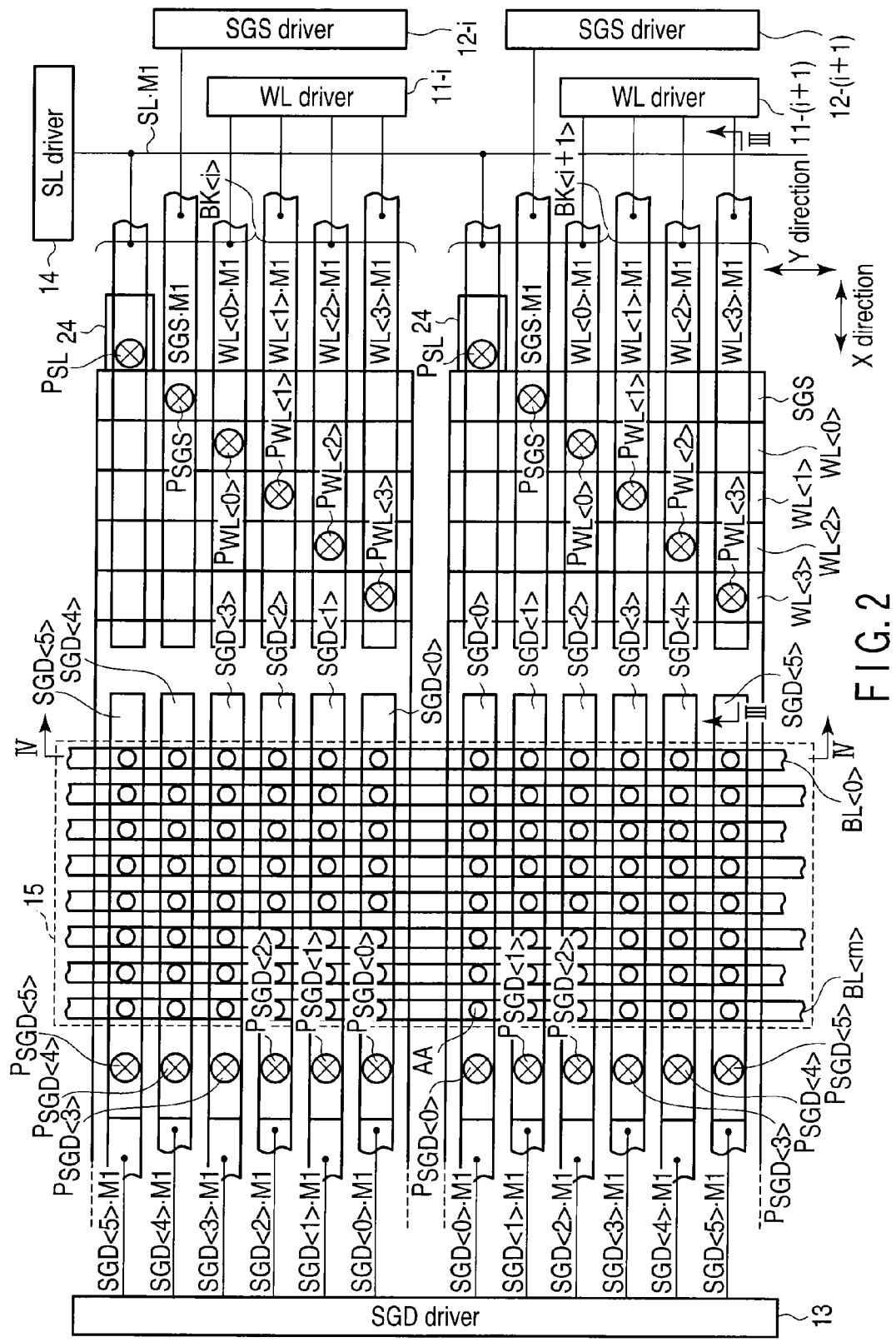
FIG. 2 is a plan view of the BiCS-NAND flash memory.

FIG. 2 shows a plan view of the BiCS-NAND flash memory of FIG. 1.

The columnar active layers AA are disposed in an array-state when viewed from the upper surface of the semiconductor substrate and comprise a memory cell array 15. Although the NAND cell unit is formed in each of the active layers AA, it will be described later in detail.

WL drivers 11-i and 11(i+1) are connected to the word lines WL<0>, WL<1>, WL<2>, and WL<3> through the interconnect lines WL<0>•M1, WL<1>•M1, WL<2>•M1, WL<3>•M1 and drive them in write, in read, and in erase.

SGS drivers 12-i and 12-(i+1) are connected to the select gate line SGS on the source line side through the interconnect line SGS•M1. A SGD driver 13 is connected to the select gate lines SGD<0>, . . . , SGD<5> on the bit line side through the interconnect lines SGD<0>•M1, . . . , SGD<5>•M1.

An SL driver 14 is connected to the source diffusion layer 24 through the source line SL•M1.

In this layout, the WL drivers 11-i and 11-(i+1) and the SGS drivers 12-i and 12-(i+1) are disposed on one end side of the memory cell array 15 in the X-direction, and the SGD driver 13 is disposed on the other end side of the memory cell array 15 in the X-direction in consideration of an increase of the number of transistors comprising the drivers as a peripheral circuit.

Figure 3:
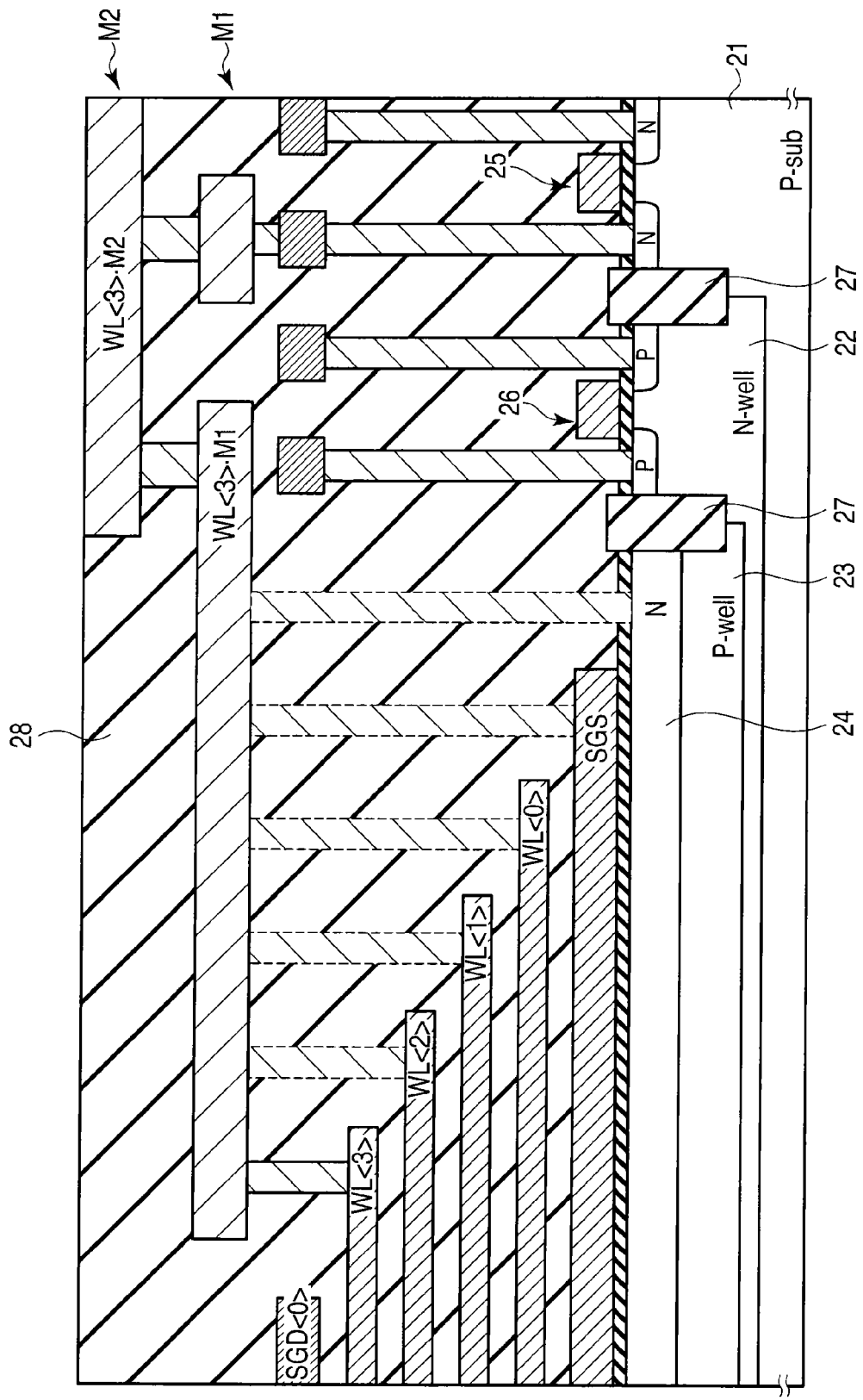
FIG. 3 is a sectional view taken along line III-III of FIG. 2.

FIG. 3 is a sectional view taken along line III-III of FIG. 2.

An N-type well region (N-well) 22 and a P-type well region (P-well) 23 are formed in a P-type semiconductor substrate (P-sub) 21. The source diffusion layer 24 is an N-type diffusion layer and formed in the P-type well region 23.

An N-channel FET (for example, N-channel MOSFET) 25 is formed in the P-type semiconductor substrate 21, and a P-channel FET (for example, P-channel MOSFET) 26 is formed in the N-type well region 22. These transistors comprise the peripheral circuit (for example, the drivers) formed in a peripheral portion of a memory cell array.

The select gate line SGS on the source line side and the word lines WL<0>, WL<1>, WL<2>, and WL<3> are connected to the transistors comprising the drivers through the interconnect line in a first metal layer M1 and through an interconnect line in a second metal layer M2 on the first metal layer M1.

To explain the word line WL<3> as an example, the word line WL<3> is connected to the N-channel FET 25 comprising a word line driver through the interconnect line WL<3>•M1 in the first metal layer M1 and through an interconnect line WL<3>•M2 in the second metal layer M2 on the first metal layer M1.

Here, gate electrodes of the N-channel FET 25 and the P-channel FET 26 are formed simultaneously with, for example, the select gate line SGS on the source line side.

That is, the gate electrodes of the N-channel FET 25 and the P-channel FET 26 have the same structure and the same thickness as those of the select gate line SGS on the source line side.

Figure 4:
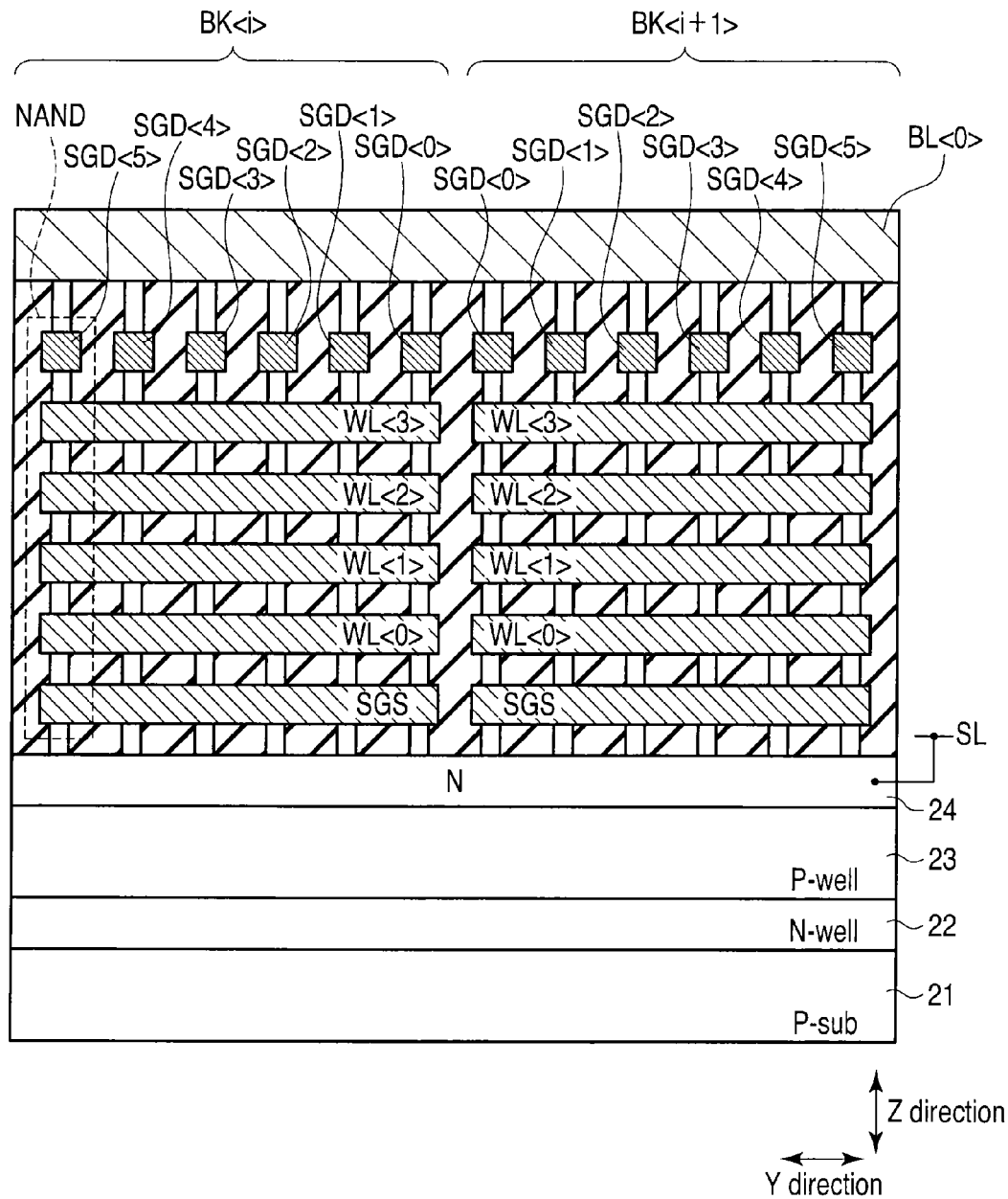
FIG. 4 is a sectional view taken along line IV-IV of FIG. 2.

FIG. 4 is a sectional view taken along line IV-IV of FIG. 2.

One ends (lowermost portions) of the active layers (active areas) AA are connected to the source diffusion layer 24 passing through the select gate line SGS on the source line side, the word lines WL<0>, WL<1>, WL<2>, and WL<3>, and the select gate lines SGD<0>, . . . , SGD<5> on the bit line side, and the other ends (uppermost portions) thereof are connected to a bit line BL<0>.

The active layers AA are formed columnarly in the Z-direction (direction vertical to the front surface of the semiconductor substrate), and the NAND cell unit NAND is formed in each of the active layers AA.

Figure 5:
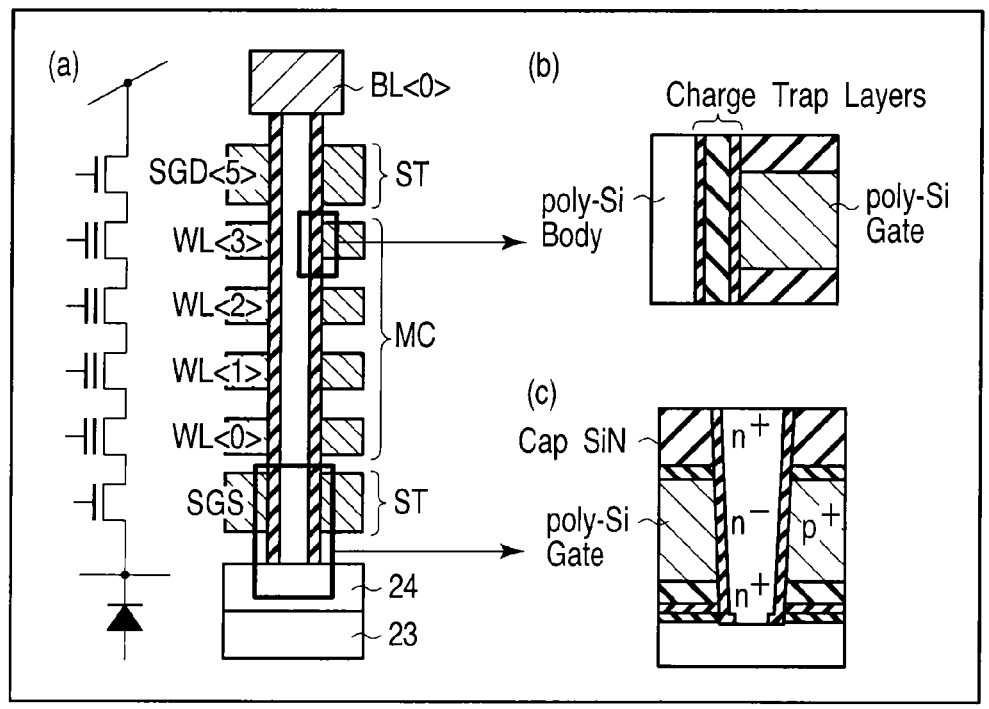
FIG. 5 is a structure view of a NAND cell unit.

FIG. 5 shows an example of a structure of the NAND cell unit NAND.

A memory cell MC has a MONOS structure.

The MONOS structure means a memory cell structure having a charge accumulation layer comprised of an insulation material such as nitride. The charge accumulation layer has a multilayer structure (charge trap layers), and ONO (oxide/nitride/oxide) is exemplified here.

A select gate transistor ST has the same structure as that of, for example, the memory cell MC.

However, a gate insulation film of the select gate transistor ST may have a structure different from that of the memory cell MC, i.e., may have a structure that includes no charge accumulation layer (for example, a single silicon oxide film).

FIG. 6 shows a bird's eye view of the NAND cell unit.

One of the features of the NAND cell unit having a three dimensional structure resides in that each of the select gate line SGS on the source line side, the word lines WL<0>, WL<1>, WL<2>, and WL<3>, and the select gate lines SGD<0>, . . . , SGD<5> on the bit line side has a structure for surrounding each of the side surfaces of the columnar active layers AA.

Accordingly, even if the active layers AA are made, for example, thinner and a larger number of the active layers AA are formed on the semiconductor substrate to increase a capacity, a force for driving the transistors comprising the NAND cell unit can be sufficiently secured.

Figure 7:
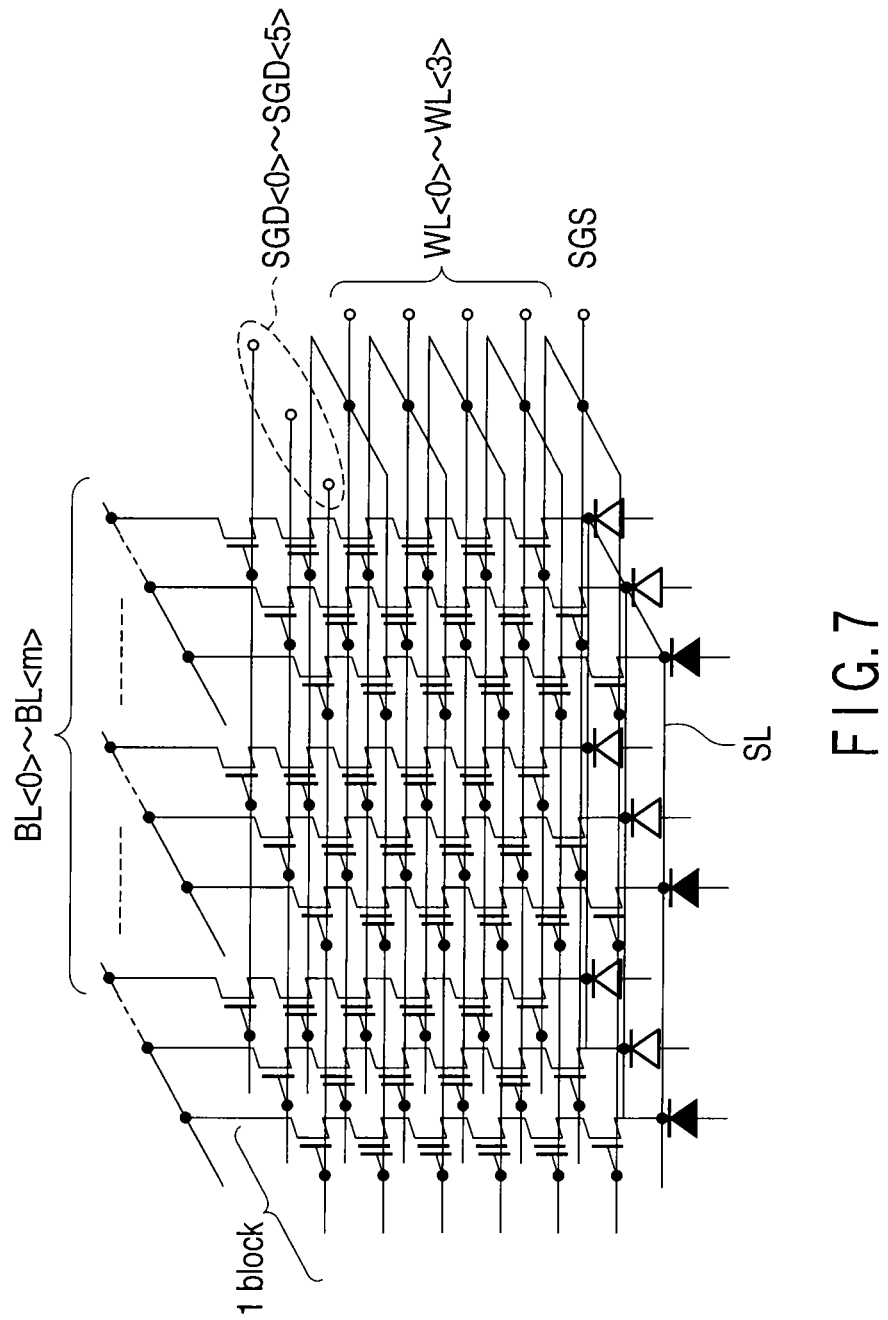
FIG. 7 is an equivalent circuit view of a memory cell array.

FIG. 7 shows an equivalent circuit of the memory cell array.

Since the BiCS-NAND flash memory has a three dimensional structure, the equivalent circuit is shown in a three dimension.

A larger number of memory cells comprising a NAND column can more contribute to an increase of the capacity. However, as the number of the memory cells comprising the NAND column is more increased, there is a possibility that the characteristics of the memory cells are dispersed in a manufacturing process from the characteristics of a BiCS structure.

When the dispersion of the characteristics is taken into consideration, the NAND column is comprised of a smaller number of the memory cells (for example, four memory cells, eight memory cells, and the like). Further, the same structure may be stacked on a structure shown by the equivalent circuit of FIG. 7.

FIG. 8 is a view showing BiCS-NAND in comparison with two-dimensional NAND.

In the NAND flash memory having the two-dimensional structure (two-dimensional NAND), one NAND cell unit in one block is connected to one bit line BL, whereas in the BiCS-NAND, NAND cell units in one block are connected to one bit line BL.

Accordingly, as explained below, one of the cell units in the one block connected to the one bit line BL is selected by the select gate lines SGD<0>, . . . , SGD<5> on the bit line side in a write operation and a read operation.

(2) Basic Operations

Basic operations of the BiCS-NAND flash memory of FIGS. 1 to 8 will be explained.

Since the basic write, read, and erase operations are the same as those of the NAND flash memory having the two-dimensional structure, matters specific to the BiCS-NAND flash memory will be explained here.

The concept of one block of the BiCS-NAND flash memory is different from that of the NAND flash memory having the two-dimensional structure.

Although the one NAND cell unit in the one block is connected to the one bit line BL in the NAND flash memory having the two-dimensional structure, the NAND cell units in the one block are connected to the one bit line BL in the BiCS-NAND flash memory.

For example, in the plan view of FIG. 2, six NAND cell units (corresponding to the number of the active layers AA in the figure) in the block BK<i+1> are connected to the bit line BL<0>.

Accordingly, in the write operation and the read operation, one of the six NAND cell units in the block BK<i+1> connected to the bit line BL<0> must be selected.

The selection is performed by select gate lines SGD<0>, . . . , SGD<5> on the bit line side. The select gate lines SGD<0>, . . . , SGD<5> on the bit line side are individually connected to six NAND cell units in the Y-direction in the block BK<i+1>.

The erase operation is performed collectively to, for example, all the memory cells in one block like the NAND flash memory having the two-dimensional structure.

The BiCS-NAND flash memory can be applied to both a binary memory, which stores binary data in one memory cell, and a multi-level memory which stores multi-level data having a ternary or more value in one memory cell.

3. Embodiments

Embodiments of the present invention will be explained.

(1) Block Layout

FIG. 9 shows a first example of a block layout of a BiCS memory.

The block layout corresponds to, for example, the BiCS-NAND flash memory of FIG. 1 and has a feature in that a select gate line driver on a bit line side is disposed on one end of a memory cell array and a word line driver and a select gate line driver on a source line side are disposed on the other end of the memory cell array.

A driver 33L, a level shifter 34L, and an address decoder 35L are disposed on one end of the memory cell array 31 in the X-direction (on a left side). The driver 33L is a driver for driving a select gate line SGD on the bit line side and includes a transfer transistor.

A driver 33R, a level shifter 34R, and an address decoder 35R are disposed on the other end of the memory cell array 31 in the X-direction (on a right side). The driver 33R is a driver for driving a word line WL and a select gate line SGS on the source line side and includes a transfer transistor. Further, a sense amplifier 32 is disposed on one end of the memory cell array 31 in the Y-direction. Bit lines BL<0>, . . . , BL<m> extending in the Y-direction are disposed on the memory cell array 31 and connected to the sense amplifier 32.

Since the block layout corresponds to the BiCS-NAND flash memory of FIG. 1, the select gate lines SGD on the bit line side are disposed in blocks BK<0>, BK<1>, . . . , BK<n>, respectively. That is, since the area of the driver for driving the select gate lines SGD on the bit line side is increased, a select gate line driver on the bit line side is disposed on the one end of the memory cell array 31 in addition to the word line driver and the select gate line driver on the source line side disposed on the other end of the memory cell array 31.

FIG. 10 shows a second example of the block layout of the BiCS memory.

A feature of the second example resides in that drivers 33 for driving a word line WL, a select gate line SGS on a source line side, and a select gate line SGD on a bit line side are disposed together on one end of a memory cell array 31 in comparison with the first example.

The drivers 33, a level shifter 34, and an address decoder 35 are disposed on one end of the memory cell array 31 in the X-direction (on a left side). The drivers 33 are drivers for driving the word line WL, the select gate line SGS on the source line side, and the select gate line SGD on the bit line side and include transfer transistors.

Further, a sense amplifier 32 is disposed on one end of the memory cell array 31 in the Y-direction. Bit lines BL<0>, . . . , BL<m> extending in the Y-direction are disposed on the memory cell array 31 and connected to the sense amplifier 32.

Since the drivers 33 for driving the word line WL, the select gate line SGS on the source line side and the select gate line SGD on the bit line side are disposed together as described above, an address decoder 34 and a level shifter 35 can be also disposed together at the same position. As a result, a layout of a peripheral circuit can be made efficiently.

However, in the above block layout, when the size of the memory cell array 31 is increased and further a memory cell is miniaturized and the word line WL, the select gate line SGS on the source line side and the select gate line SGD on the bit line side are disposed at narrow pitches, a problem arises in that a signal is delayed by a parasitic capacitance.

In particular, in the BiCS memory, the word line WL and the select gate line SGS on the source line side are formed in a plate shape. Accordingly, coupling noise is caused by an increase of a parasitic capacitance between the conductive wires.

FIG. 11 shows a third example of the block layout of the BiCS memory.

A feature of the third example resides in that two memory cell arrays 31L and 31R are disposed in comparison with the second example. Since disposition of the two memory cell arrays 31L and 31R can reduce the lengths of a word line WL, a select gate line SGS on a source line side, and a select gate line SGD on a bit line side in each memory cell array, a signal delay and coupling noise can be suppressed.

The memory cell arrays 31L and 31R are disposed in the X-direction side by side. Drivers 33L and 33R, a level shifter 34, and an address decoder 35 are interposed between the memory cell arrays 31L and 31R. The drivers 33L and 33R drive the word line WL, the select gate line SGS on the source line side, and the select gate line SGD on the bit line side and include transfer transistors.

Further, sense amplifiers 32L and 32R are disposed on one ends of the memory cell arrays 31L and 31R in the Y-direction. Bit lines BL<0>, . . . , BL<m> extending in the Y-direction are disposed on the memory cell arrays 31L and 31R and connected to the sense amplifiers 32L and 32R.

Although the level shifter 34 and the address decoder 35 are shared by the two memory cell arrays 31L and 31R in the block layout, the driver 33L is disposed in correspondence with the memory cell array 31L, and the driver 33R is disposed in correspondence with the memory cell array 31R.

A reason why the drivers 33L and 33R cannot be shared by the two memory cell arrays 31L and 31R as described above is that since the drivers are comprised of a lot of transistors, when they are shared by the memory cell arrays 31L and 31R, a layout of wirings for connecting the memory cell arrays 31L and 31R to the drivers 33L and 33R is made complex. That is, when a driver is disposed on each memory cell array, a layout of wirings is more simplified than a case that the drivers are shared by the two memory cell arrays.

FIG. 12 shows a fourth example of the block layout of the BiCS memory.

A feature of the fourth example resides in that a driver 33 for driving a word line WL, a select gate line SGS on a source line side, and a select gate line SGD on a bit line side is shared by two memory cell arrays 31L and 31R in comparison with the third example.

The driver 33 can be shared by reducing the area thereof, i.e., by reducing the number of transistors comprising the driver 33. More specifically, this is because a layout of wirings for connecting the memory cell arrays 31L and 31R to the driver 33 is not made complex by reducing the number of the transistors. Although the number of the transistors comprising the driver 33 is reduced by a layout of the select gate line on the bit line side according to the present invention, this will be described later and only the block layout will be explained here.

The memory cell arrays 31L and 31R are disposed in the X-direction side by side. The driver 33, a level shifter 34, and an address decoder 35 are interposed between the memory cell arrays 31L and 31R. The driver 33 drives the word line WL, the select gate line SGS on the source line side and the select gate line SGD on the bit line side and includes a transfer transistor.

Further, sense amplifiers 32L and 32R are disposed on one ends of the memory cell arrays 31L and 31R in the Y-direction. Bit lines BL<0>, . . . , BL<m> extending in the Y-direction are disposed on the memory cell arrays 31L and 31R and connected to the sense amplifiers 32L and 32R.

In the block layout, the driver 33, the level shifter 34, and the address decoder 35 are shared by the two memory cell arrays 31L and 31R.

Note that if the driver 33 can be shared by the two memory cell arrays 31L and 31R without making a wiring layout complex, the block layout of the fourth example will be most preferable in the first to fourth examples.

(2) Layout of Select Gate Line on Bit Line Side

Figure 13:
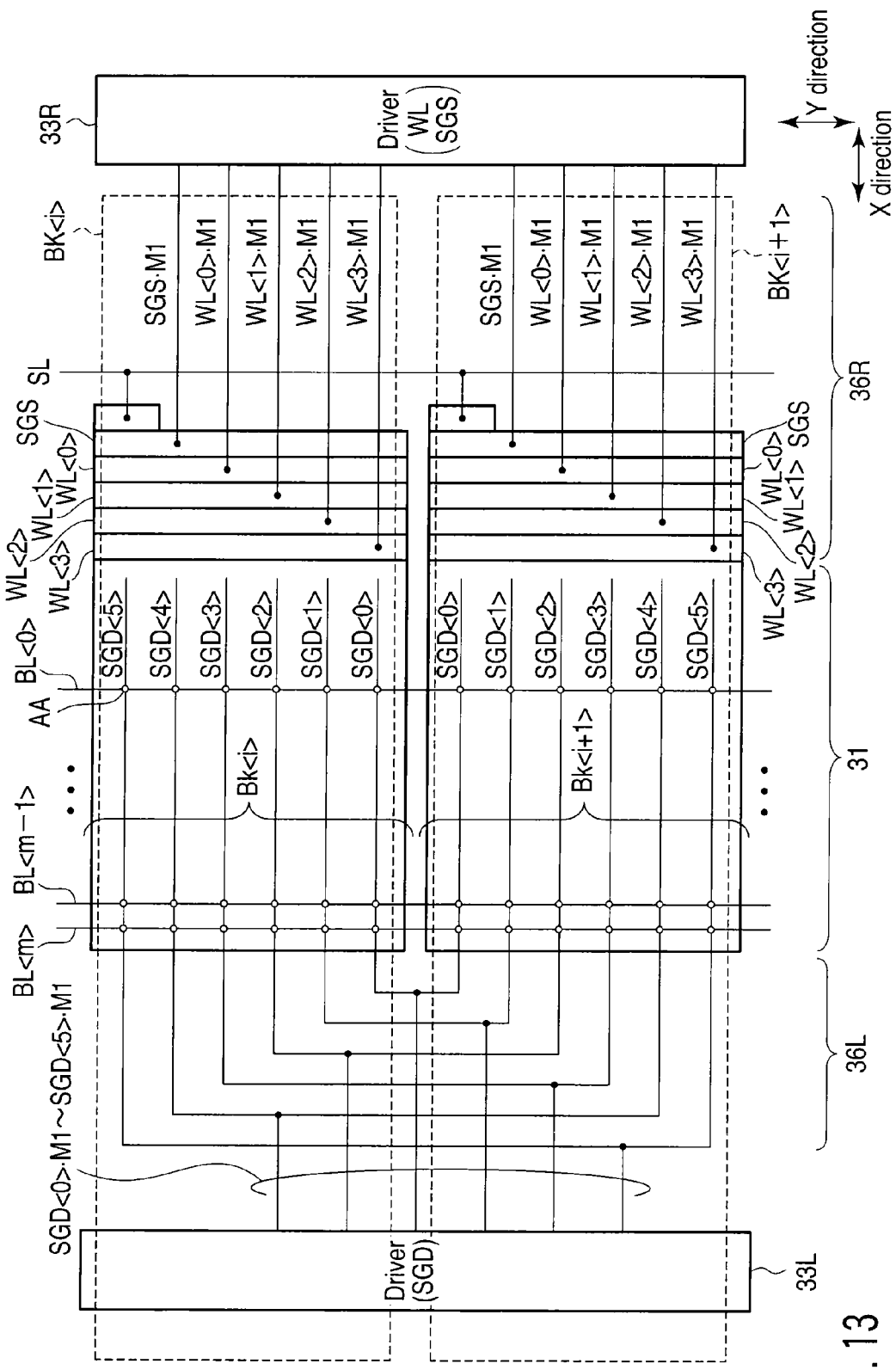
FIG. 13 is a view showing a layout of select gate lines on a bit line side.
Figure 14:
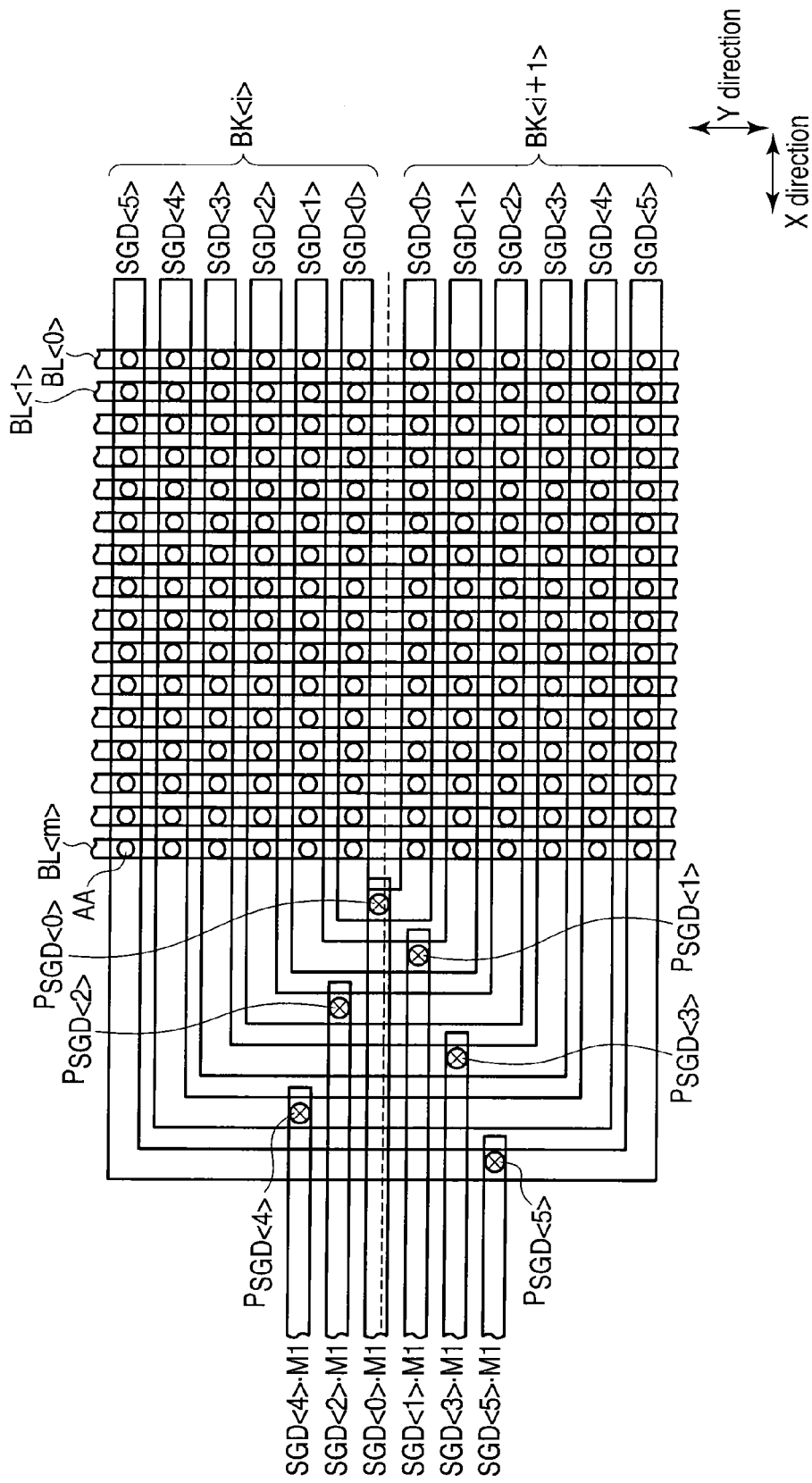
FIG. 14 is a plan view when the select gate lines on the bit line side shown in FIG. 13 are arranged as a device.

FIG. 13 shows a first example of a layout of select gate lines on a bit line side. FIG. 14 shows a layout viewed on a plan view when the select gate lines shown in FIG. 13 are arranged as a device.

The first example corresponds to the block layout of FIG. 9. That is, a driver 33L connected to select gate lines SGD<0>, . . . , SGD<5> on a bit line side is disposed on one end (left side) of a memory cell array 31 in the X-direction as well as disposed independently of a driver 33R connected to word lines WL<0>, . . . , WL<3> and to a select gate line SGS on a source line side.

Each of two blocks BK<i>, BK<i+1> is comprised of at least three conductive layers, which are insulated from each other and stacked on a semiconductor substrate, bit lines BL<0>, . . . , BL<m>, which are insulated from the at least three conductive layers and disposed thereon, and active layers (columnar semiconductors) AA whose lower ends are connected to the semiconductor substrate, whose upper ends are connected to the bit lines BL<0>, . . . , BL<m>, and which pass through the at least three conductive layers.

The uppermost layer of the at least three conductive layers is comprised of the select gate lines SGD<0>, . . . , SGD<5> on the bit line side, the lowermost layer of the at least three conductive layers is the select gate line SGS on the source line side, and the remaining conductive layers excluding the uppermost and lowermost layers of the at least three conductive layers are the word lines WL<0>, . . . , WL<3>.

In the first example, although the number of the select gate lines SGD<0>, . . . , SGD<5> on the bit line side is six and the number of the word lines WL<0>, . . . , WL<3> is four in one block, respectively, the numbers are not limited thereto. That is, it is sufficient that the number of the select gate lines on the bit line side and the number of the word lines be at least one in the one block, respectively.

Further, the remaining conductive layers excluding the uppermost layer of the at least three conductive layers have a plate shape whose width in the Y-direction is larger than that in the Y-direction of the select gate lines SGD<0>, . . . , SGD<5> on the bit line side.

Select gate transistors on the bit line side are comprised of the select gate lines SGD<0>, . . . , SGD<5> on the bit line side and the active layers AA, and select gate transistors on the source line side are comprised of the select gate line SGS on the source line side and the active layers AA. Further, memory cells are comprised of the word lines WL<0>, . . . , WL<3> and the active layers AA.

Further, the region between the memory cell array 31 and the driver 33L is arranged as an interconnect portion 36L in which interconnect lines (conductive wires) SGD<0>•M1, . . . , SGD<5>•M1 are disposed to connect the memory cell array 31 to the driver 33L. Likewise, the region between the memory cell array 31 and the driver 33R is arranged as an interconnect portion 36R in which interconnect lines (conductive wires) WL<0>•M1, . . . , WL<3>•M1, and SGS•M1 are disposed to connect the memory cell array 31 to the driver 33R.

The select gate lines SGD<0>, SGD<5> on the bit line side in the block BK<i> and the select gate lines SGD<0>, . . . , SGD<5> on the bit line side in the block BK<i+1> are connected to the driver 33L after they are commonly connected in the relation of one to one in one end in the X-direction of the memory cell array 31.

Specifically, an i-th (i is a natural number) select gate line on the bit line side from the block BK<i+1> side of the select gate lines SGD<0>, . . . , SGD<5> on the bit line side in the block BK<i> is commonly connected to an i-th select gate line on the bit line side from the block BK<i> side of the select gate lines SGD<0>, . . . , SGD<5> on the bit line side in the block BK<i+1>.

Accordingly, the select gate lines SGD<0>, . . . , SGD<5> on the bit line side have a folded layout in their entirety.

The folded layout can be easily formed by making use of, for example, a side wall masking technology for etching a ground layer using a side wall as a mask.

Figure 15:
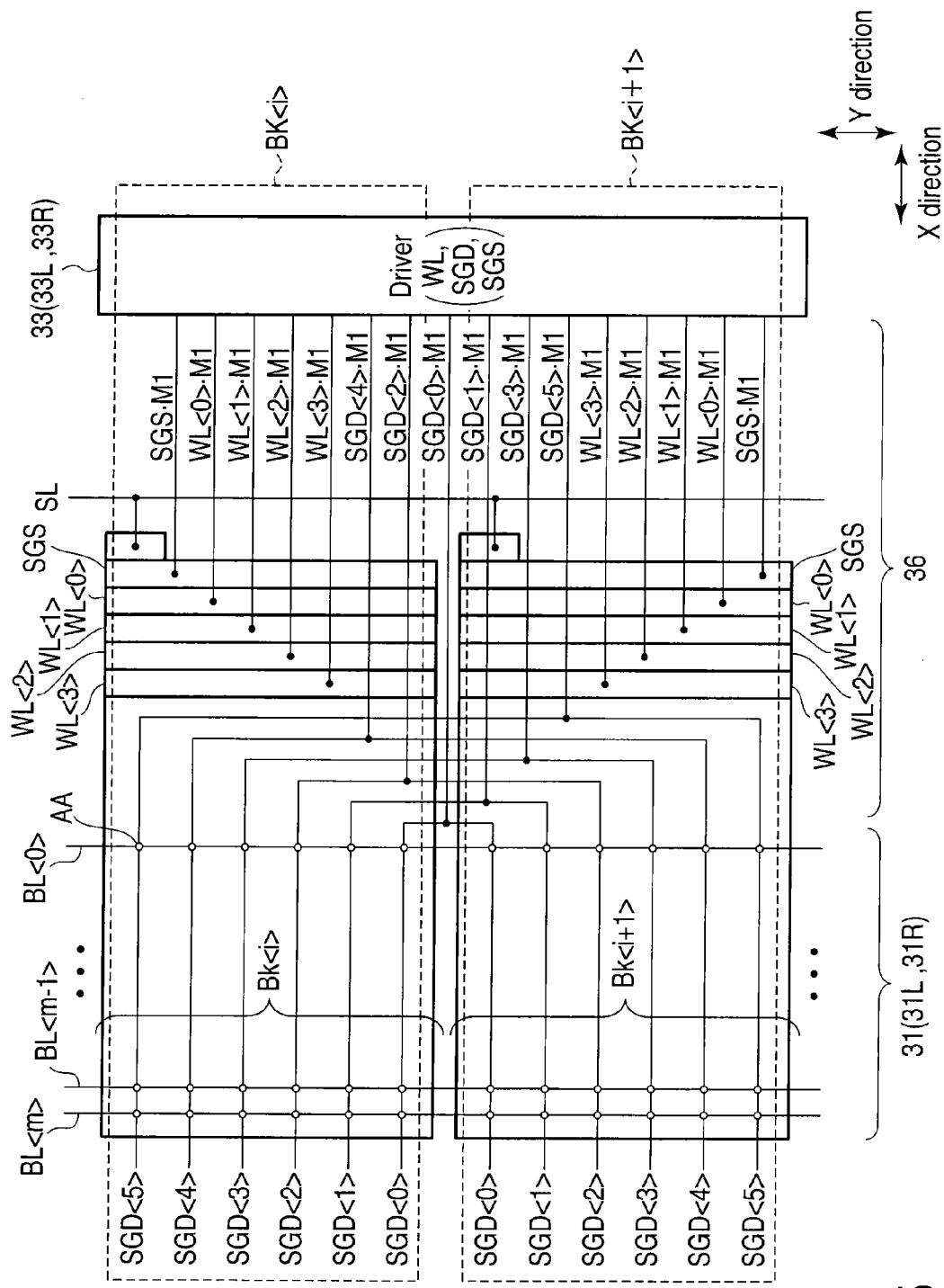
FIG. 15 is a view showing a layout of select gate lines on a bit line side.

FIG. 15 shows a second example of a layout of select gate lines on a bit line side. FIG. 16 shows a layout viewed on a plan view when the select gate lines shown in FIG. 15 are arranged as a device.

The second example corresponds to the block layout of FIGS. 10 to 12. That is, a driver 33 (33L and 33R) disposed on one end (right side) of a memory cell array 31 in the X-direction are connected to word lines WL<0>, . . . , WL<3>, a select gate line SGS on a source line side, and select gate lines SGD<0>, . . . , SGD<5> on a bit line side.

Attention must be paid to the fact that the portions, to which the layouts of FIGS. 15 and 16 are applied as they are, are limited to the portion between the memory cell array 31L and the driver 33L of FIG. 11 and to the portion between the memory cell array 31L and the driver 33 of FIG. 12.

The layouts, which are obtained by reversing the layouts of FIGS. 15 and 16 in a right to left direction, are applied to the remaining portions between the memory cell array 31 and the driver 33 of FIG. 10, between the memory cell array 31R and the driver 33R of FIG. 11, and between the memory cell array 31R and the driver 33 of FIG. 12.

Each of two blocks BK<i>, BK<i+1> is comprised of at least three conductive layers, which are insulated from each other and stacked on a semiconductor substrate, bit lines BL<0>, . . . , BL<m>, which are insulated from the at least three conductive layers and disposed thereon, and active layers (columnar semiconductors) AA whose lower ends are connected to the semiconductor substrate, whose upper ends are connected to the bit lines BL<0>, ..., BL<m>, and which pass through the at least three conductive layers.

The uppermost layer of the at least three conductive layers is comprised of the select gate lines SGD<0>, ..., SGD<5> on the bit line side, the lowermost layer of the at least three conductive layers is a select gate line SGS on the source line side, and the remaining conductive layers excluding the uppermost and lowermost layers of the at least three conductive layers are the word lines WL<0>, ..., WL<3>.

In the second example, although the number of the select gate lines SGD<0>, ..., SGD<5> on the bit line side is six and the number of the word lines WL<0>, ..., WL<3> is four in one block, respectively, the numbers are not limited thereto. That is, it is sufficient that the number of the select gate lines on the bit line side and the number of the word lines be at least one in the one block, respectively.

Further, the remaining conductive layers excluding the uppermost layer of the at least three conductive layers have a plate shape whose width in the Y-direction is larger than the width in the Y-direction of the select gate lines SGD<0>, ..., SGD<5> on the bit line side.

Select gate transistors on the bit line side are comprised of the select gate lines SGD<0>, ..., SGD<5> on the bit line side and the active layers AA, and select gate transistors on the source line side are comprised of the select gate line SGS on the source line side and the active layers AA. Further, memory cells are comprised of the word lines WL<0>, ..., WL<3> and the active layers AA.

Further, the region between the memory cell array 31 (31L and 31R) and the driver 33L (33L and 33R) is arranged as an interconnect portion 36 in which interconnect lines (conductive wires) WL<0>•M1, ..., WL<3>•M1, SGS•M1, SGD<0>•M1, ..., SGD<5>•M1 are disposed to connect the memory cell array 31 to the driver 33.

The select gate lines SGD<0>, ..., SGD<5> on the bit line side in the block BK<i> and the select gate lines SGD<0>, ..., SGD<5> on the bit line side in the block BK<i+1> are connected to the driver 33 (33L and 33R) after they are commonly connected in the relation of one to one in one end in the X-direction (right side) of the memory cell array 31.

Specifically, an i-th (i is a natural number) select gate line on the bit line side from the block BK<i+1> side of the select gate lines SGD<0>, ..., SGD<5> on the bit line side in the block BK<i> is commonly connected to an i-th select gate line on the bit line side from the block BK<i> side of the select gate lines SGD<0>, ..., SGD<5> on the bit line side in the block BK<i+1>.

Accordingly, the select gate lines SGD<0>, ..., SGD<5> on the bit line side have a folded layout in their entirety.

The folded layout can be easily formed by making use of, for example, a side wall masking technology for etching a ground layer using a side wall as a mask.

FIG. 17 shows a layout in which drivers are disposed on both the sides of a memory cell array.

As shown in FIG. 17, when the drivers 33 are disposed on both the sides of the memory cell array 31, the size of the drivers 33 in the Y-direction per, for example, one block can be increased (the number of transistors can be increased). As a result, since the size of the drivers 33 in the X-direction can be decreased (the number of transistors can be decreased), the layout of interconnect lines (conductive wires) WL<0>•M1, ..., WL<3>•M1, SGS•M1, SGD<0>•M1, ..., SGD<5>•M1 in an interconnect portion 36 is further simplified.

Note that whether the drivers 33 (33L and 33R) are disposed on one sides of the memory cell arrays 31 (31L and 31R) as shown in FIGS. 10 to 12 or the drivers 33 are disposed on both the sides of the memory cell array 31 as shown in FIG. 17 is determined in consideration of the specification of the BiCS memory (chip), the area efficiency of the peripheral circuit, and the like.

(3) Example of Driver Circuit

An example of a driver circuit will be explained using a BiCS-NAND flash memory as an example.

Figure 18:
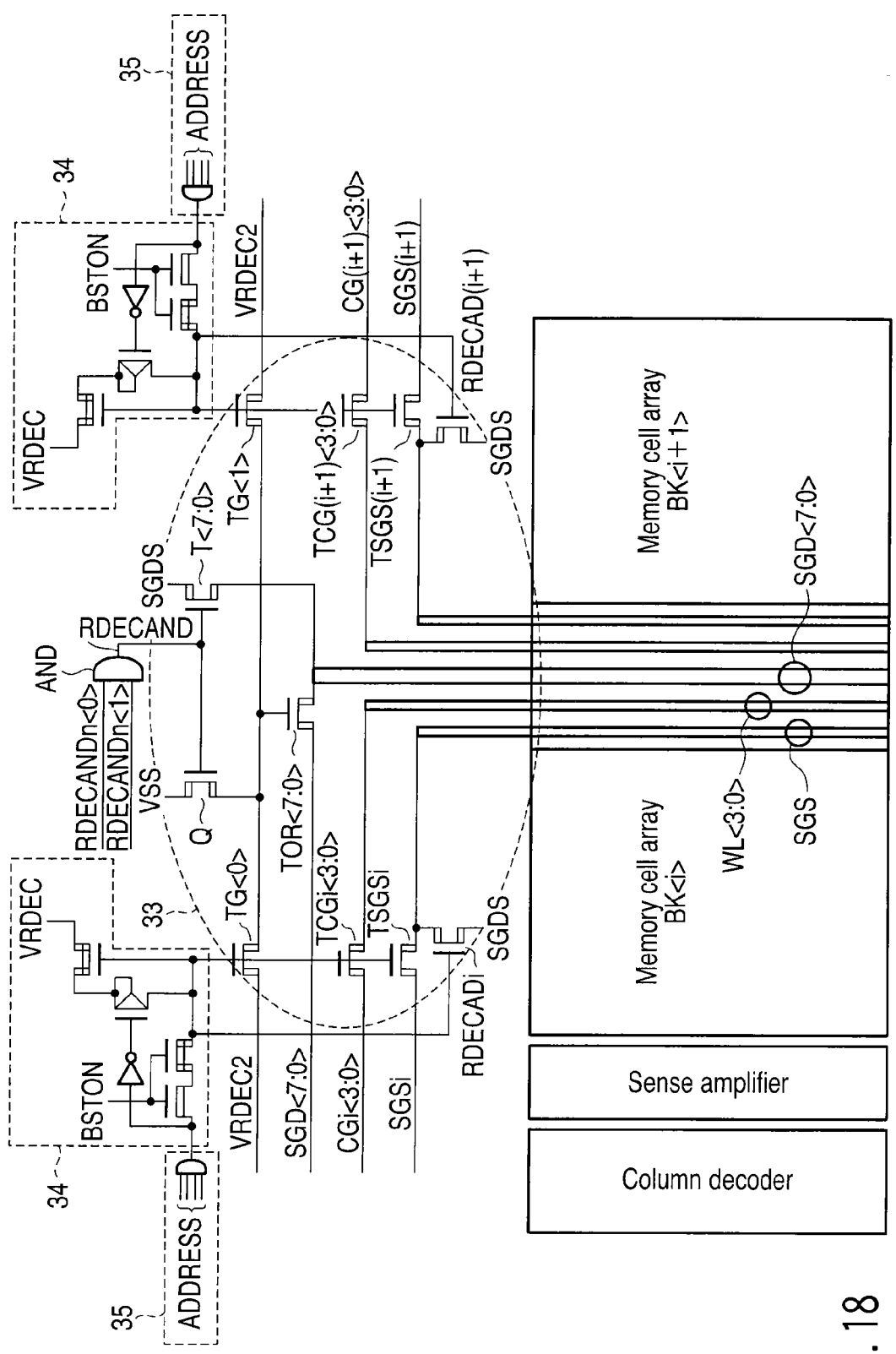
FIG. 18 is a view showing an example of a driver circuit.

FIG. 18 shows the example of the driver circuit.

It is assumed that each of memory cell arrays is arranged such that four word lines are disposed in one block (four layers), eight select gate lines (one layer) are disposed on a bit line side, and one select gate line (one layer) is disposed on a source line side.

A driver 33 is comprised of a transfer transistor (high voltage transistor) to which a high voltage is applied. Each of row decoders 35 is comprised of an AND circuit and decodes an address signal ADDRESS. Level shifters 34 are connected between the driver 33 and the row decoders 35.

BSTON, VRDEC, RDECANDn<0>, and RDECANDn<1> are control signals for turning on and off transfer transistors, and SGD<7:0>, CGi<3:0>, CG(i+1)<3:0>, SGSi, SGS(i+1), VRDEC2, and SGDS are transfer voltages.

(4) Program Disturb and Programming Method

A. Program Disturb

First, program disturb specific to a BiCS memory will be explained using a BiCS-NAND flash memory as an example.

Figure 19:
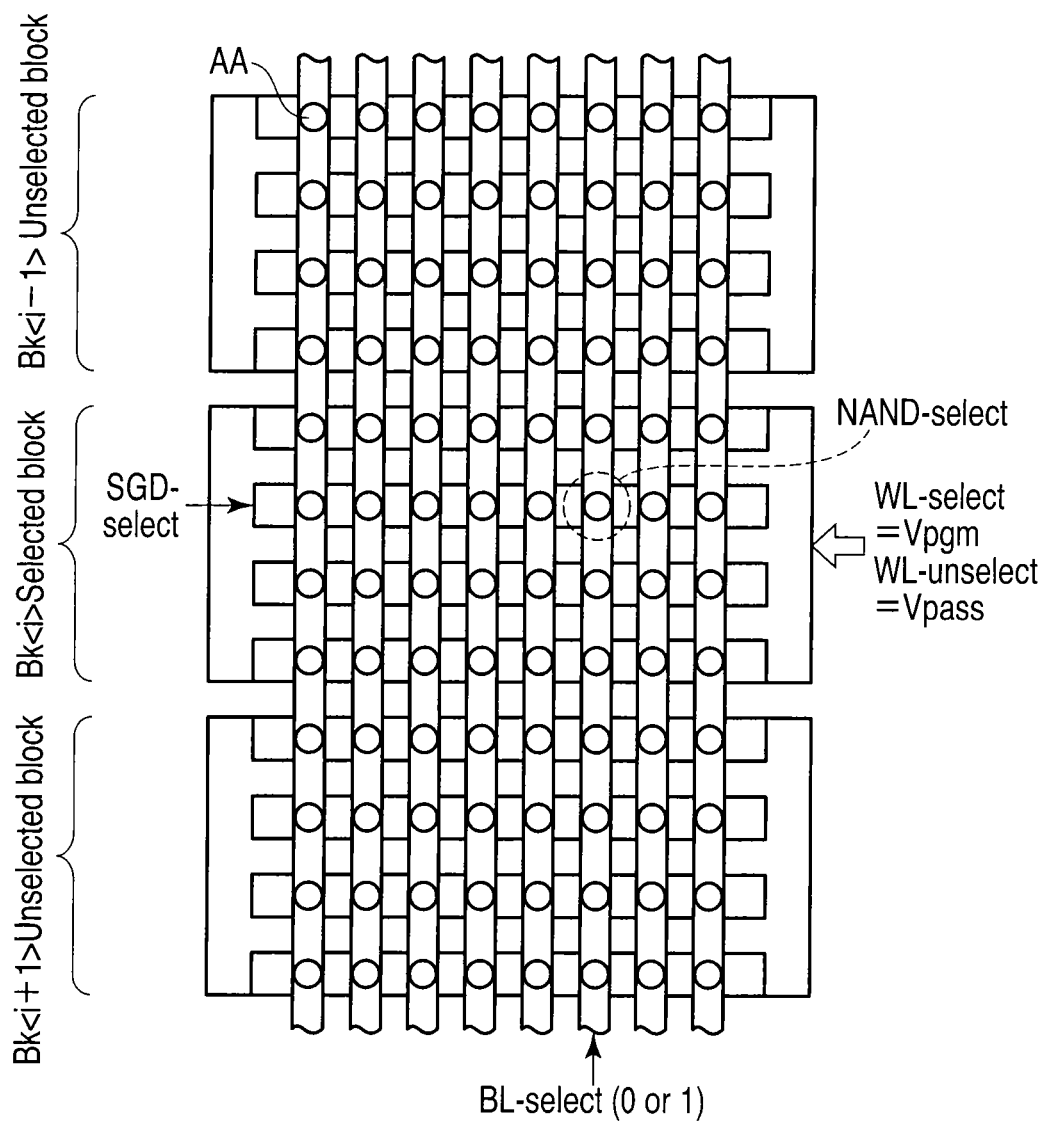
FIG. 19 is a view explaining program disturb of a BiCS memory.

FIG. 19 shows three blocks.

It is assumed that a block BK<i> is a selected block and blocks BK<i−1> and BK<i+1> are non-selected blocks.

The selected block BK<i> has a selected NAND cell unit NAND-select including a memory cell to be programmed. The NAND cell unit NAND-select is located at the intersection point where a selected bit line BL-select and a selected select gate line SGD-select on the bit line side intersect with each other.

In programming, a program potential Vpmg is applied to a selected word line WL-select in the selected block BK<i>, and a transfer potential Vpass lower than the program potential Vpmg is applied to non-selected word lines WL-unselect in the selected block BK<i>.

Since the NAND cell units in the block BK<i> share the word lines, the program potential Vpmg and the transfer potential Vpass are applied also to the non-selected NAND cell units other than the selected NAND cell unit in the block BK<i>.

When the programming is performed, the relation of the potentials in the block BK<i> is as shown in FIG. 20.

The program potential Vpmg is applied to the selected word line WL-select, and the transfer potential Vpass is applied to the non-selected word lines WL-unselect. Further, Vsgd (for example, about 4 V) is applied to a selected select gate line SGD-select on the bit line side as a potential for turning on select gate transistors on the bit line side, and Vss (for example, 0 V) is applied to non-selected select gate lines SGD-unselect on the bit line side as a potential for turning off the select gate transistors on the bit line side. A potential according to program data ("0" or "1") is applied to the selected bit line BL-select.

At this time, program disturb is liable to occur particularly in a non-selected memory cell X1 connected to the word line WL-select to which the program potential Vpgm is applied. A channel boost technology is applied to improve the program disturb.

In, for example, a NAND type flash memory having a two dimensional structure, the channel boost technology is applied to a memory cell subjected to write prohibition ("1"-programming) to prevent an increase of the threshold value of the memory cell. However, in a BiCS-NAND flash memory, the channel boost technology is applied to a non-selected NAND cell unit in a selected block as described above unlike the NAND type flash memory having the two dimensional structure.

Thus, the channel boost technology is applied in consideration of a structure (operation) specific to the BiCS-NAND flash memory.

B. First Programming Method

FIG. 21 is a timing chart showing a first programming method.

First, word lines WL<0>, WL<1>, WL<2>, WL<3>, bit lines BL<0>, BL<1>, select gate lines SGD on a bit line side, source lines SL, and select gate lines SGS on a source line side are set to VSS (for example, 0 V) in all the blocks.

Figure 22:
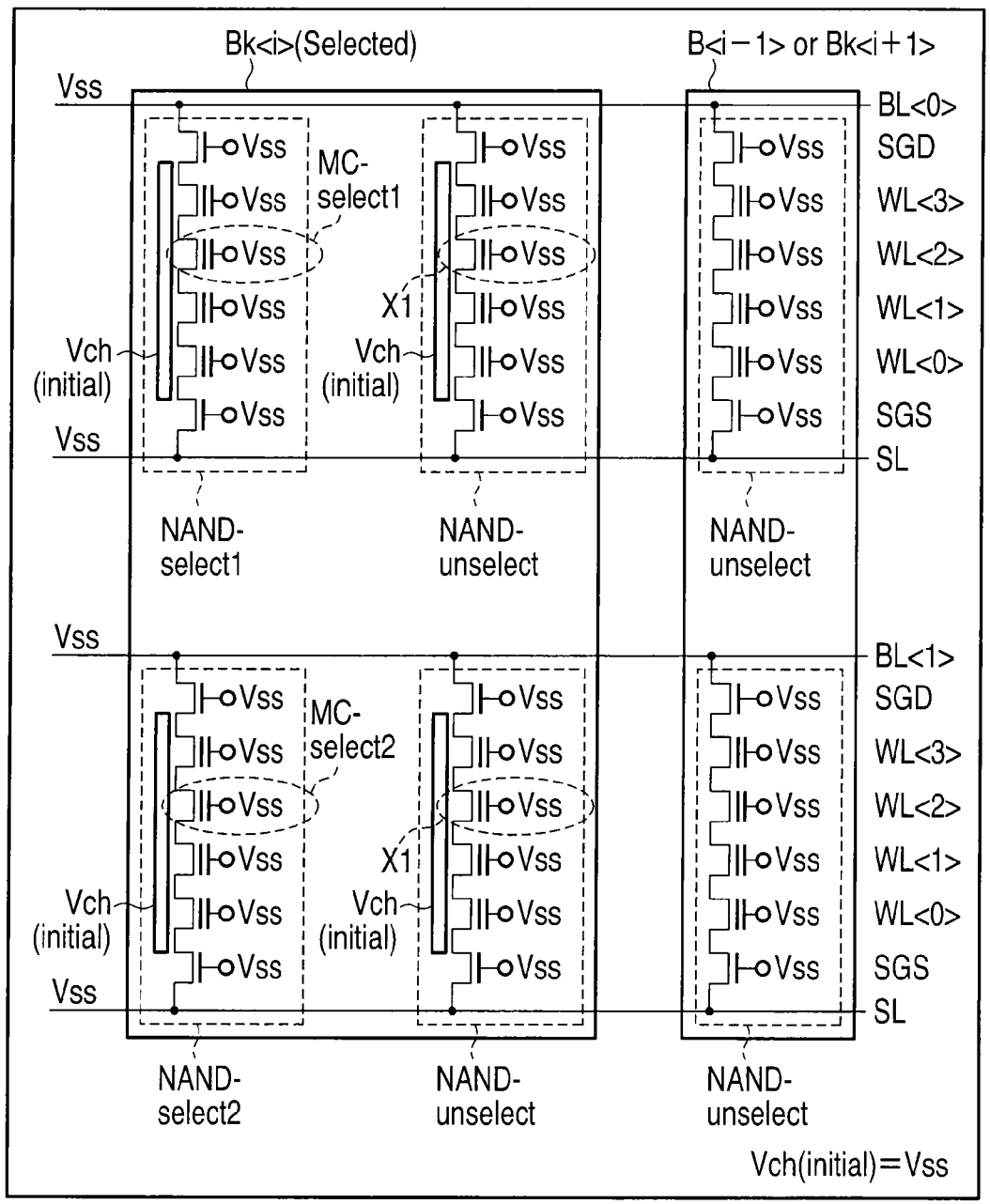
FIG. 22 is a view showing a potential relation of the first programming method.

That is, as shown in FIG. 22, the initial potentials of the channels of NAND cell units NAND-select1, NAND-select2, and NAND-unselect in a selected block BK<i> are set to Vss.

Thereafter, the bit lines BL<0>, BL<1> are set to values according to program data as well as the select gate lines SGD on the bit line side in the selected NAND cell units NAND-select1 and NAND-select2 are set to Vsgd (line A). Vsgd shows a potential of, for example, about 4 V by which the program data can transferred. The select gate line SGD on the bit line side in the non-selected NAND cell unit NAND-unselect remains Vss (line B).

Further, when the program data is set to "0", the bit lines are set to Vss (for example, 0 V), whereas when the program data is set to "1", the bit lines are set to Vdd (for example, plus potential).

Figure 23:
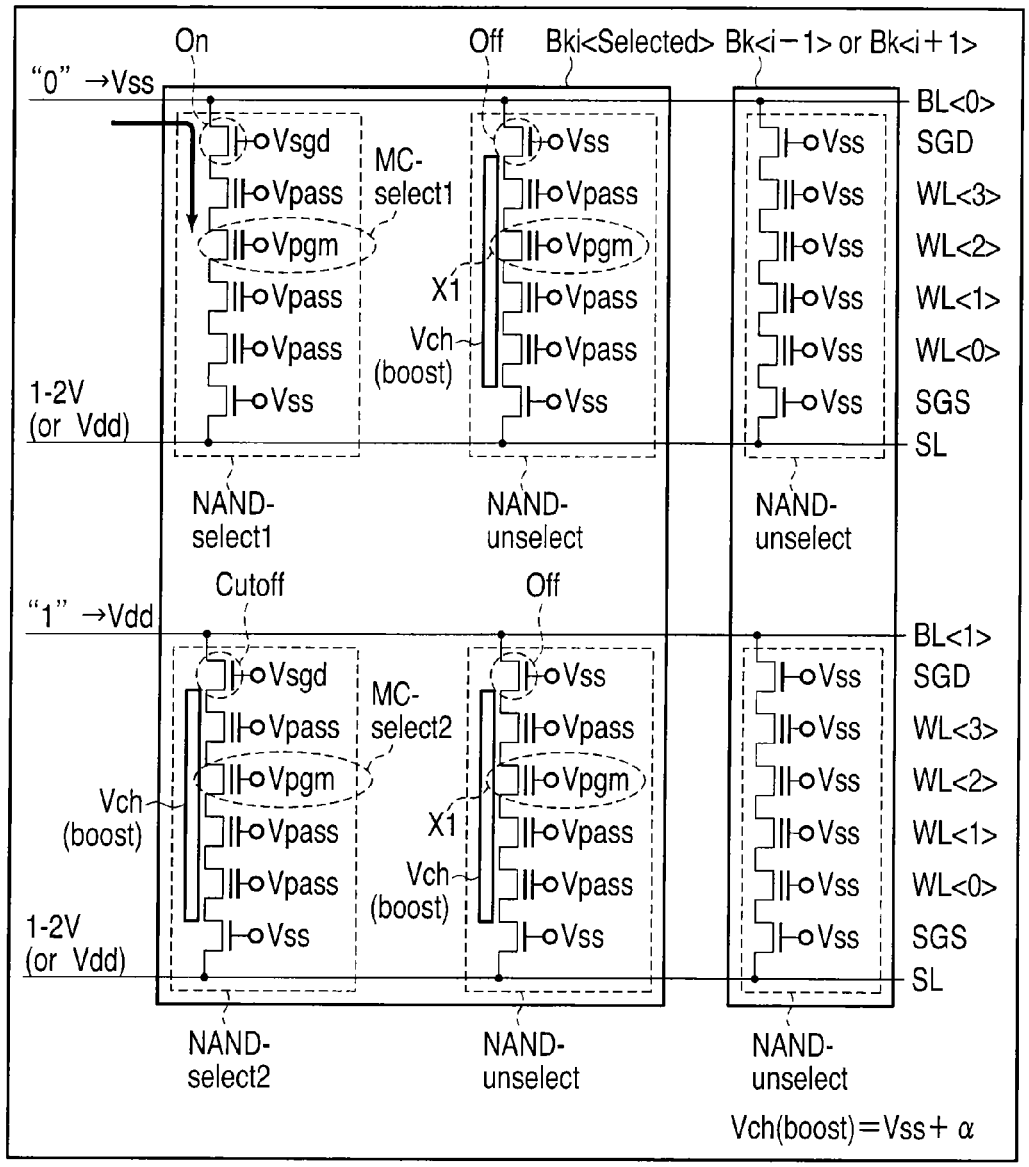
FIG. 23 is a view showing a potential relation of the first programming method.

As shown in FIG. 23, it is assumed here that "0"-programming (write) is performed to a selected memory cell MC-select1 in the selected block BK<i>, and "1"-programming (write prohibition) is performed to a selected memory cell MC-select2 in the selected block BK<i>.

In the NAND cell unit NAND-select1, since select gate transistors on the bit line side are turned on, the potential Vss of the bit line BL<0> is transferred to the channel of the memory cell in the NAND cell unit NAND-select1. Accordingly, when a program potential Vpgm is applied to a word line WL<2> in the selected block BK<i>, write (an increase of threshold value) is permitted to the selected memory cell MC-select1.

In contrast, in the NAND cell unit NAND-select2, when a transfer potential Vpass is applied to the word lines WL<0>, WL<1>, WL<2>, and WL<3> in the selected block BK<i>, the select gate transistors on the bit line side are turned off. Accordingly, when the program potential Vpgm is applied to the word line WL<2> in the selected block BK<i>, the channel potential of the selected memory cell MC-select2 is boosted, and the write (an increase of threshold value) is prohibited to the selected memory cell MC-select2. Further, in the non-selected NAND cell unit NAND-unselect in the selected block BK<i>, the select gate transistors on the bit line side and select gate transistors on the source line side remain turned off together. Accordingly, when the transfer potential Vpass and the program potential Vpgm are applied to the word lines WL<0>, WL<1>, WL<2>, WL<3> in the selected block BK<i>, the channel potential of the memory cell in the non-selected NAND cell unit NAND-unselect is boosted. Thus, the program disturb (variation of threshold value) can be prevented.

The first programming method improves the program disturb to the memory cell in the non-selected NAND cell unit NAND-unselect in the selected block BK<i>. However, the first programming method cannot sufficiently improve the program disturb to a non-selected memory cell X1 to which the program potential Vpgm is applied.

C. Second Programming Method

A second programming method proposes a technology for improving the program disturb also to the non-selected memory cell X1 to which the program potential Vpgm is applied by sufficiently increasing the channel potential of the memory cell in the non-selected NAND cell unit NAND-unselect.

FIG. 24 is a timing chart showing the second programming method.

First, the word lines WL<0>, WL<1>, WL<2>, WL<3>, the bit lines BL<0>, BL<1>, the select gate lines SGD on the bit line side, the source lines SL, and the select gate lines SGS on the source line side are set to VSS (for example, 0 V) in all the blocks.

At this time, as shown in FIG. 25, the initial potentials of the channels of the NAND cell units NAND-select1, NAND-select2, and NAND-unselect in the selected block BK<i> are set to Vss.

Thereafter, the bit lines BL<0>, BL<1> are set to a value according to the program data as well as all the select gate lines SGS on the source line side in the selected block BK<i> are set to Vsgs. Vsgs is a value by which a precharge potential to be described later can be transferred, i.e., a potential of, for example, about 4 V. The select gate lines SGS on the source line side in the non-selected blocks BK<i-1>, BK<i+1> remain Vss.

Further, a potential VP-pre, by which a memory cell is turned on regardless of the state of the threshold value thereof is applied to all the word lines WL<0>, WL<1>, WL<2>, WL<3> in the selected block BK<i>. The potential VP-pre is a potential which is the same as or nearly equal to, for example, a read potential Vread which is applied to a non-selected memory cell in read.

The plus potential, for example, Vdd is applied to a source line SL as a precharge potential, further all the select gate lines SGD on the bit line side remain Vss, and the select gate transistors on the bit line side remain turned off.

Figure 27:
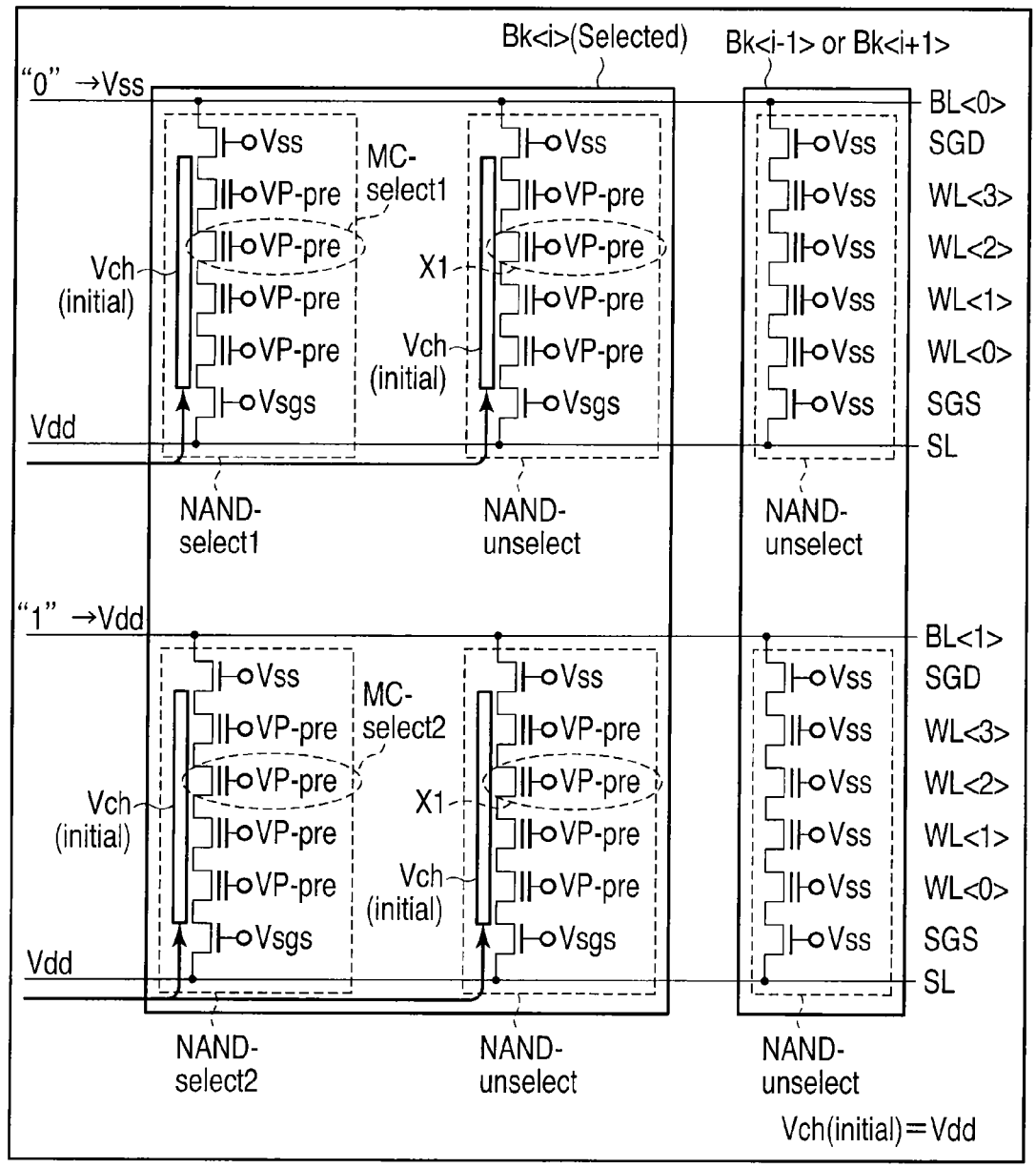
FIG. 27 is a view showing a potential relation of the second programming method.

As a result, the initial potentials of the channels of the memory cells in all the NAND cell units NAND-select1, NAND-select2, and NAND-unselect in the selected block BK<i> are precharged to the plus potential, for example, Vdd as shown FIGS. 26 and 27.

The precharge to the channels are performed in parallel with the operation for setting the bit lines BL<0>, BL<1> to the value according to the program data.

The bit lines are set to Vss (for example, 0 V) when the program data is set to "0" and set to Vdd (for example, plus potential) when the program data is set to "1".

Thereafter, the select gate lines SGD on the bit line side in the selected NAND cell units NAND-select1, NAND-select2 are set to Vsgd (line A). Vsgd is a value by which the program data can be transferred, i.e., a potential of, for example, about 4 V. The select gate line SGD on the bit line side in the non-selected NAND cell unit NAND-unselect remains Vss (line B).

As shown in FIG. 28, it is assumed here that the "0"-programming (write) is performed to the selected memory cell MC-select1 in the selected block BK<i>, and the "1"-programming (write prohibition) is performed to the selected memory cell MC-select2 in the selected block BK<i>.

In the NAND cell unit NAND-select1, since select gate transistors on the bit line side are turned on, the potential Vss of the bit line BL<0> is transferred to the channel of the memory cell in the NAND cell unit NAND-select1. Accordingly, when the program potential Vpgm is applied to the word line WL<2> in the selected block BK<i>, write (an increase of threshold value) is permitted to the selected memory cell MC-select1.

In contrast, in the NAND cell unit NAND-select2, when the transfer potential Vpass is applied to the word lines WL<0>, WL<1>, WL<2>, and WL<3> in the selected block BK<i>, the select gate transistors on the bit line side are turned off. Accordingly, when the program potential Vpgm is applied to the word line WL<2> in the selected block BK<i>, the channel potential of the selected memory cell MC-select2 is boosted, and the write (an increase of threshold value) is prohibited to the selected memory cell MC-select2.

Further, in the non-selected NAND cell unit NAND-unselect in the selected block BK<i>, the select gate transistors on the bit line side and the select gate transistors on the source line side remain turned off together. Accordingly, when the transfer potential Vpass and the program potential Vpgm are applied to the word lines WL<0>, WL<1>, WL<2>, WL<3> in the selected block BK<i>, the channel potential of the memory cell in the non-selected NAND cell unit NAND-unselect is boosted. Thus, the program disturb (variation of threshold value) can be prevented.

In the second programming method, the initial potentials of the channels of the NAND cell units NAND-select1, NAND-select2, NAND-unselect in the selected block BK<i> are set to the plus potential as compared with the first programming method. As a result, since the channel potential of the memory cell in the non-selected NAND cell unit NAND-unselect is sufficiently boosted, the program disturb can be sufficiently improved to the non-selected memory cell X1 to which the program potential Vpgm is applied.

D. Others

In the first and second programming methods, the potential of the select gate lines SGD on the bit line side is set to a potential larger than Vss and smaller than Vsgd, for example, about 2 V after it is set to Vsgd (for example, 4 V) as shown in FIGS. 21 and 24. The value is a value by which "0" (=Vss) can be transferred. However, the potential of the select gate lines SGD on the bit line side is not limited to the above value and may remain, for example, Vsgd or may be dropped from Vsgd to Vss.

Further, in the second programming method, the potential of the select gate lines SGS on the source line side is set to Vsgs (for example, 4 V) and then dropped to Vss again as shown in FIG. 24. However, the potential of the select gate lines SGS on the source line side is not limited to the above value and may be changed from Vsgs to, for example, a plus potential slightly higher than Vss (line C). In this case, the plus potential is a potential that can securely turn off the select gate transistors on the source side.

Further, in the second programming method, the potential of the word lines WL<0>, WL<1>, WL<2>, WL<3>, may be set from VP-pre to Vpass and further from Vpass to Vpgm. Further, the potential may be dropped from VP-pre to Vss or to a value near Vss once and then may be set to Vpass and further to Vpgm as shown in FIG. 24.

(5) Conclusion

As described above, according to the embodiment of the present invention, program disturb of a three dimensional stacked nonvolatile semiconductor memory to which a BiCS technology is applied can be improved.

4. Application Example

Although the technology of the present invention is effective for a BiCS-NAND flash memory in which one cell unit is comprised of memory cells (NAND columns) connected to each other in series to realize bit cost scalability, the technology can be also applied to a three dimensional stacked nonvolatile semiconductor memory to which the BiCS technology is applied in addition to the above BiCS-NAND flash memory.

For example, the technology of the present invention is also effective for a nonvolatile semiconductor memory which has exactly the same device structure as that of the BiCS-NAND flash memory but in which only one central memory cell of memory cells in one cell unit is used as a memory cell and the remaining memory cells are used as dummy cells as an example other than the BiCS-NAND flash memory.

Further, as to a memory cell structure of the BiCS memory, it is considered that a so-called MONOS type, in which a charge accumulation layer is comprised of an insulation material (for example, nitride), is effective, but the example of the present invention is not limited thereto and can be also applied to a floating gate type in which a charge accumulation layer is comprised of conductive polysilicon.

Further, a data value stored in one memory cell may be a binary value (two-level) or a multivalue (multi-level) of at least a ternary value (three-level).

5. Advantages

According to the present invention, program disturb of a three dimensional stacked nonvolatile semiconductor memory to which a BiCS technology is applied can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for controlling a non-volatile semiconductor memory device including a plurality of blocks, the plurality of blocks including a first block, the first block including a first cell unit and a second cell unit, both the first cell unit and the second cell unit being connected to a bit line, the first cell unit including first memory cells, a first transistor, and a second transistor, gates of the first memory cells being connected to a plurality of word lines, gate of the first transistor being connected to a first line, gate of the second transistor being connected to a second line, comprising:

writing a data to selected memory cell in first cell unit on the condition that a first voltage is applied to the second line in a first period, a second voltage is applied to both a selected word line and non-selected word lines before the first period, a third voltage is applied to the first line in a second period, a fourth voltage is applied to both the selected word line and the non-selected word lines in the second period, a fifth voltage is applied to the selected word line in a third period, and the fourth voltage is applied to the non-selected word lines in the third period, and wherein the fifth voltage is higher than the fourth voltage, the fourth voltage is higher than the second voltage, the selected word line is electrically connected to a selected memory cell and the non-selected word lines are electrically connected to non-selected memory cells.

2. The method according to claim 1, wherein the fist transistor being connected to the bit line.

3. The method according to claim 1, wherein a sixth voltage is applied to the second line after the first period, the sixth voltage being lower than the first voltage.

4. The method according to claim 3, wherein a seventh voltage is applied to the first line in the third period, the seventh voltage being lower than the third voltage.

5. The method according to claim 4, the sixth voltage is substantially 0V, and the seventh voltage is substantially 2V.

6. The method according to claim 1, the first voltage is substantially 4V, both the second voltage and the fourth voltage are capable of turning on both the selected memory cell and non-selected memory cells regardless of holding data, and the third voltage is substantially 4V.

7. The method according to claim 1, further comprising:
a source line electrically connected to the second transistor, and
wherein an eighth voltage is applied to the source line and the eighth voltage is plus voltage.

8. A method for controlling a non-volatile semiconductor memory device including a plurality of memory cells, the plurality of memory cells being stacked above the semiconductor substrate, the non-volatile semiconductor memory device including a first cell unit, the first cell unit including a first memory cells connected in series, a first transistor and a second transistor, comprising:
writing a data to a selected memory cell in first cell unit on the condition that a first voltage is applied to gate of the first transistor in a first period, a second voltage is applied to both gate of the selected memory cell and gates of non-selected memory cells before the first period, a third voltage is applied to gate of the second transistor in a second period, a fourth voltage is applied to both gate of the selected memory cell and gates of non-selected memory cells in the second period, a fifth voltage is applied to gate of the selected memory cell in a third period, and the fourth voltage is applied to gates of non-selected memory cells in the third period, and
wherein the fifth voltage is higher than the fourth voltage and the fourth voltage is higher than the second voltage.

9. The method according to claim 8, wherein a sixth voltage is applied to gate of the first transistor after the first period, the sixth voltage being lower than the first voltage.

10. The method according to claim 9, wherein a seventh voltage is applied to gate of the second transistor in the third period, the seventh voltage being lower than the third voltage.

11. The method according to claim 10, the sixth voltage is substantially 0V, and the seventh voltage is substantially 2V.

12. The method according to claim 8, the first voltage is substantially 4V, both the second voltage and the fourth voltage are capable of turning on both the selected memory cell and non-selected memory cells regardless of holding data, and the third voltage is substantially 4V.

13. The method according to claim 8, wherein the second transistor is electrically connected to a bit line, the first transistor is electrically connected to a source line,
wherein an eighth voltage is applied to the source line and the eighth voltage is plus voltage.

14. A nonvolatile semiconductor memory comprising:
a memory cell array including a first and second block;
a first driver disposed adjacent to the memory cell array;
wherein the first block has a first cell unit including a first memory cell and a second cell unit including a second memory cell, and the first cell unit and the second cell unit are connected to a bit line, and programming is executed to the first memory cell by applying a program voltage or a transfer voltage lower than the program voltage to word lines in the first block after an initial voltage of channels of the memory cells in the first and second cell units is set to a plus voltage, and
wherein the program voltage and the transfer voltage are not applied to word lines in the second block in the programming.

15. The memory according to claim 14, wherein the plus voltage is transferred from a source line to channels of memory cells in the first and second cell unit.

16. The memory according to claim 14, wherein when the program voltage or the transfer voltage is applied to the word lines in the first block, the channel is boosted from the initial voltage to a voltage higher than the initial voltage.

17. The memory according to claim 14, wherein when the programming is programming for prohibiting an increase of a threshold voltage of the memory cell to be programmed, a channel of a memory cell in the first cell unit is boosted from the initial voltage to a voltage higher than the initial voltage when the program voltage or the transfer voltage is applied to the channel.

18. The memory according to claim 14, wherein when the programming is programming for permitting an increase of a threshold voltage of the memory cell to be programmed, a channel of a memory cell in the first cell unit is changed from the initial voltage to a ground voltage before the program voltage or the transfer voltage is applied to the channel.

19. The memory according to claim 14, wherein the memory cell comprises a NAND cell unit.

20. A method for controlling a non-volatile semiconductor memory device including a plurality of blocks, the plurality of blocks including a first block, the first block including a first cell unit and a second cell unit, the first cell unit including a first memory cell, a second memory cell, a first transistor and a second transistor, gate of the first memory cell being connected to a first word line, gate of the second memory cell being connected to a second word line, the second cell unit including a third memory cell, a fourth memory cell, a third transistor and a fourth transistor, gate of the third memory cell being connected to a first word line, gate of the fourth memory cell being connected to a second word line, one of the third transistor being connected to a first line, gate of the third transistor being connected to a second line, gate of the fourth transistor being connected to a third line, comprising:
a program operation performed for a selected memory cell in first cell unit, the program opreration including a first operation, the first operation being performed on the condition that a first voltage is applied to the first, a second voltage is applied to the second line, a third voltage is applied to the third line, a fourth voltage is applied to the first word line and the second word line, and
wherein the fourth voltage is higher than the third voltage, the second voltage is higher than the third voltage, the first voltage is higher than the third voltage.

21. The method according to claim 20, wherein the program includes a second operation, the second operation being performed after the first operation, the second operation being performed on the condition that a fifth voltage is applied to the first word line and the fourth voltage is applied to the second word line when the first word line is selected, the fifth voltage being higher than the fourth voltage.

22. The method according to claim 20, wherein the first cell unit and second cell unit are connected to a first source line.

* * * * *